United States Patent
Yang et al.

(10) Patent No.: US 10,249,720 B2
(45) Date of Patent: Apr. 2, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Wentao Yang, Kowloon (HK); Johnny Kin On Sin, Kowloon (HK); Yuichi Onozawa, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/473,687

(22) Filed: Mar. 30, 2017

(65) Prior Publication Data

US 2017/0250257 A1 Aug. 31, 2017

Related U.S. Application Data

(63) Continuation of application No. PCT/JP2016/001056, filed on Feb. 26, 2016.

(51) Int. Cl.
*H01L 29/40* (2006.01)
*H01L 21/3213* (2006.01)
(Continued)

(52) U.S. Cl.
CPC ...... *H01L 29/407* (2013.01); *H01L 21/32131* (2013.01); *H01L 21/32139* (2013.01);
(Continued)

(58) Field of Classification Search
None
See application file for complete search history.

(56) References Cited

U.S. PATENT DOCUMENTS

| 5,691,553 A | 11/1997 | Mori et al. |
| 6,388,286 B1 * | 5/2002 | Baliga ............... H01L 21/82348 |
| | | 257/330 |

(Continued)

FOREIGN PATENT DOCUMENTS

| JP | H08-88346 A | 4/1996 |
| JP | 2006-120807 A | 5/2006 |

(Continued)

OTHER PUBLICATIONS

L. Théolier et al., "A new junction termination technique: the Deep Trench Termination ($DT^2$)", IEEE, pp. 176-179, Jun. 2009.

(Continued)

*Primary Examiner* — Michelle Mandala
(74) *Attorney, Agent, or Firm* — Rabin & Berdo, P.C.

(57) ABSTRACT

At edge termination region, a trench is disposed near an interface of an active region. Inside the trench, an embedded insulating film is embedded, and inside the embedded insulating film, a FP long in a direction of depth is disposed. The FP curves outwardly away from an inner side wall of the trench as a depth from a base front surface increases. At least near a bottom end of the FP, a distance between the FP and the inner side wall of the trench is greater than a width of the groove. The FP is connected to a front surface electrode that extends on the embedded insulating film. As a result, breakdown voltage may be enhanced, adverse effects of the surface charge may be reduced, and chip size may be further reduced.

9 Claims, 34 Drawing Sheets

(51) Int. Cl.
*H01L 21/761* (2006.01)
*H01L 29/06* (2006.01)

(52) U.S. Cl.
CPC ........ *H01L 21/761* (2013.01); *H01L 29/0623* (2013.01); *H01L 29/401* (2013.01); *H01L 29/404* (2013.01); *H01L 29/408* (2013.01)

(56) References Cited

U.S. PATENT DOCUMENTS

| | | | |
|---|---|---|---|
| 8,872,257 | B1 | 10/2014 | Matsuoka et al. |
| 8,872,278 | B2 * | 10/2014 | Hao .................... H01L 29/4236 257/401 |
| 2002/0053718 | A1 | 5/2002 | Stoisiek |
| 2005/0167749 | A1 | 8/2005 | Disney |
| 2007/0085111 | A1 | 4/2007 | Cao et al. |
| 2007/0181975 | A1 | 8/2007 | Koops et al. |
| 2009/0008723 | A1 | 1/2009 | Schmidt |
| 2011/0241110 | A1 | 10/2011 | Xiao et al. |
| 2012/0306044 | A1 | 12/2012 | Bobde et al. |
| 2012/0306046 | A1 | 12/2012 | Schmidt |
| 2013/0069109 | A1 | 3/2013 | Matsuda et al. |
| 2013/0207227 | A1 | 8/2013 | Azam et al. |
| 2016/0181413 | A1 | 6/2016 | Fujita |

FOREIGN PATENT DOCUMENTS

| | | |
|---|---|---|
| JP | 2007-528598 A | 10/2007 |
| JP | 5135663 B2 | 2/2013 |
| JP | 2015-510696 A | 4/2015 |

OTHER PUBLICATIONS

Shigeto Honda et al., "A concept of a novel edge termination technique : Junction Termination (RJT)", Proceedings of the 22nd International Symposium on Power Semiconductor Devices & ICs, Hiroshima, pp. 111-114, Jun. 2010.

* cited by examiner

SEMICONDUCTOR DEVICE AND METHOD OF MANUFACTURING SEMICONDUCTOR DEVICE

CROSS REFERENCE TO RELATED APPLICATIONS

This non-provisional application is a continuation of International Application PCT/JP2016/001056, filed on Feb. 26, 2016, and designating the U.S., the entire contents of which are incorporated herein by reference.

BACKGROUND OF THE INVENTION

1. Field of the Invention

Embodiments of the invention relate to a semiconductor device and a method of manufacturing the semiconductor device.

2. Description of the Related Art

To control electric field concentration at the device end (chip end), in one known high voltage structure, a field limiting ring (FLR) that is a floating (floating electric potential) p-type region is disposed in plural in an edge termination region that surrounds the periphery of an active region. In another known high voltage structure, a field plate (FP), which is a metal electrode or a polysilicon (poly-Si) electrode connected to an FLR, is disposed. The FP controls that way that the depletion layer spreads, prevents degradation of the breakdown voltage, and has a function of controlling the surface charge distribution and property changes consequent to the surface charge.

A structure of the edge termination region of a semiconductor device will be described. FIG. 35 is a cross sectional view of a structure of an edge termination region of a conventional semiconductor device. The conventional semiconductor device depicted in FIG. 35 includes a high voltage structure formed by FLRs 103 and FPs 106, in an edge termination region 112 surrounding a periphery of an active region 111. The active region 111 is a region in which current flows during the ON state. The edge termination region 112 is a region that relaxes the electric field of a substrate front-surface side of an n$^-$-type drift region 101 and maintains the breakdown voltage. The FLR 103 is disposed in plural, concentrically surrounding the periphery of the active region 111, in a surface layer of a front surface of an n$^-$-type semiconductor substrate (semiconductor chip) 110 that becomes the n$^-$-type drift region 101.

In the edge termination region 112, the front surface of the n$^-$-type semiconductor substrate 110 is covered by an interlayer insulating film 107. The FP 106 contacts the FLR 103 via a contact hole that penetrates the interlayer insulating film 107 in a direction of depth. The FP 106 is disposed for each the FLRs 103. Further, the FP 106 extends inwardly (the active region 111 side) or outwardly (the chip end side), or both, on the interlayer insulating film 107. Reference numeral 102 represents a p-type region configuring a pn junction (main junction) with the n$^-$-type drift region 101, in the active region 111. Reference numerals 104, 105, and 108 represent a p-type channel stop region, a local oxidation of silicon (LOCOS), and a passivation film, respectively.

A principle of operation at the edge termination region 112 where the FLRs 103 are disposed will be described. FIG. 36 is a diagram depicting the principle of operation at the edge termination region of a conventional semiconductor device. In FIG. 36, (a) and (b) respectively depict temporally from the left, transition of electric field distribution and charge distribution corresponding to (c). In FIG. 36, (c) depicts temporally by broken lines 121a and 121b, end positions of a depletion layer 121 extending outwardly when the semiconductor device is OFF. The horizontal axes in FIG. 36 represent a distance r expressing positional relations of parts, in a direction from an inner side toward an outer side. At (a), the vertical axis represents electric field strength E. At (b), the vertical axis represents charge q and an upper quadrant above the horizontal axis represents negative charge $N_D$ while a lower quadrant below the horizontal axis represents positive charge $N_A$. Further, at (c), the vertical axis represents a depth d of the front surface of the n$^-$-type semiconductor substrate 110.

When the semiconductor device is OFF and a pn junction (hereinafter, main junction) 120 between the p-type region 102 and the n$^-$-type drift region 101 in the active region 111 is reverse biased, the depletion layer 121 is formed along the main junction 120, and extends outwardly accompanying an increase in the reverse biasing. Furthermore, although the electric field strength near an end of the active region 111 (near an end 102a of the p-type region 102) increases ((a) of FIG. 36) accompanying the reverse biasing, near an end of the active region 111, before avalanche breakdown occurs, the depletion layer 121 reaches the innermost FLR 103 (broken line 121a in (c) of FIG. 36). As a result, the p-type region 102 and the innermost FLR 103 punchthrough, suppressing the peak electric field at the end 102a of the p-type region 102.

When the depletion layer 121 reaches the innermost FLR 103, holes (positive holes) in the innermost FLR 103 flow to the active region 111 and positive charge $N_A$ is lost (portion indicated by reference numeral 131 in (b) of FIG. 36). To compensate for the lost positive charge $N_A$ of the innermost FLR 103, the depletion layer 121 further extends outwardly (broken line 121b in (c) of FIG. 36). When the reverse biasing is further increased, although the electric field strength increases near an outer end 103a of the inner most FLR 103, before avalanche breakdown occurs at the outer end 103a of the FLR 103, the depletion layer 121 further reaches an outward FLR 103 (not depicted in (c) of FIG. 36). As a result, the FLRs 103 punchthrough, suppressing the peak electric field at the outer end 103a of the innermost FLR 103.

Thus, portions contributing to the critical electric field strength are sequentially moved outward to the outer ends 103a of the FLRs 103 such that avalanche breakdown occurs at the outermost FLR 103, whereby the electric field near the end of the active region 111 relaxes, realizing high breakdown voltage. The breakdown voltage of the semiconductor device is determined by the applied voltage that causes avalanche breakdown at the outermost FLR 103. Further, as described above, since the way the depletion layer 121 extends consequent to the balance of the charge q of the FLRs 103 is determined, the adverse effects of the charge (hereinafter, surface charge) at the surface of the interlayer insulating film 107, the interface of the interlayer insulating film 107 and the n$^-$-type semiconductor substrate 110, etc. is remarkable. Therefore, the FPs 106 and the FLRs 103 are connected respectively to reduce the adverse effects of the surface charge.

In a device proposed (for example, refer to Japanese Patent No. 5135663) as another semiconductor device equipped with FPs, a trench disposed in the edge termination region is filled with an insulating film and a FP is embedded in a recess disposed in the insulating film. In Japanese Patent No. 5135663, the depth of the FP in the insulating film is suitably adjusted, whereby a range of the quantity of surface charge allowed under the environment at the time of actual use is set and breakdown voltage that is nearly an ideal breakdown voltage (voltage causing avalanche breakdown in an ideal state when no surface charge is present) is set.

SUMMARY OF THE INVENTION

A semiconductor device according to one aspect of the present invention includes a trench disposed farther outward than an active region and reaching a predetermined depth from a first principal surface of a semiconductor substrate; a pn junction between a second conductivity type region and a first conductivity type region, and disposed in a first principal surface side of the semiconductor substrate, the pn junction extends outwardly from the active region and is terminated by the trench; an insulating film embedded inside the trench; a first field plate disposed inside the insulating film and long in a direction of depth; a first electrode contacting the second conductivity type region and the first field plate; and a second electrode disposed in a second principal surface of the semiconductor substrate. A distance between an inner side wall of the trench and the first field plate is greater than a width of the first field plate. The first field plate curves away from the inner side wall of the trench as a depth from the first principal surface of the semiconductor substrate increases.

In the semiconductor device, the distance between the inner side wall of the trench and the first field plate toward a second principal surface side of semiconductor substrate is greater than the width of the first field plate.

In the semiconductor device, a depth of the first field plate is deeper than the pn junction and shallower than the trench, from the first principal surface of the semiconductor substrate.

In the semiconductor device, the depth of the first field plate is 30% or more and 70% or less of a depth of the trench.

In the semiconductor device, a second field plate disposed inside the insulating film and long in the direction of depth. The second field plate is disposed farther outward than the first field plate and away from the first field plate.

In the semiconductor device, the second field plate curves away from an outer side wall of the trench as a depth from the first principal surface of the semiconductor substrate increases.

In the semiconductor device, a depth of the second field plate is greater than a depth of the first field plate.

In the semiconductor device, the semiconductor substrate is configured by: the second conductivity type region that contacts the first electrode disposed in the first principal surface of the semiconductor, a supporting substrate that contacts the second electrode disposed in the second principal surface of the semiconductor substrate, and the first conductivity type region between the second conductivity type region and the supporting substrate. The trench, from the pn junction, reaches a depth that is 30% or more of a thickness of the first conductivity type region and less than the thickness of the first conductivity type region.

In the semiconductor device, a width of the trench is 30% or more and 60% or less of a depth of the trench.

A method of manufacturing a semiconductor device, includes forming in a first principal surface side of a semiconductor substrate, a pn junction between a second conductivity type region and a first conductivity type region, the pn junction extending outwardly from an active region; forming farther outward than the active region, a trench that reaches a predetermined depth from the first principal surface of the semiconductor substrate and that terminates the pn junction; embedding inside the trench, an insulating film so as to leave a groove having a U-shaped cross sectional shape; forming a metal film along the groove; selectively removing the metal film to leave, as a first field plate, a remaining portion of the metal film at an inner side wall of the groove; and further embedding inside the trench, the insulating film so as to cover the first field plate. The first field plate curves away from the inner side wall of the trench as a depth from the first principal surface of the semiconductor substrate increases.

The method includes forming a reflection preventing film on the metal film, after forming the metal film and before selectively removing the metal film. Selectively removing the metal film includes: applying a resist film on the reflection preventing film, luminously exposing the resist film and forming a resist mask that covers a forming region of the first field plate, and etching using the resist mask as a mask to leave, as the first field plate, the remaining portion of the metal film at the inner side wall of the groove.

In the method according, in selectively removing the metal film, a remaining portion of the metal film, away from the first field plate, is left at an outer side wall of the groove as a second field plate.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
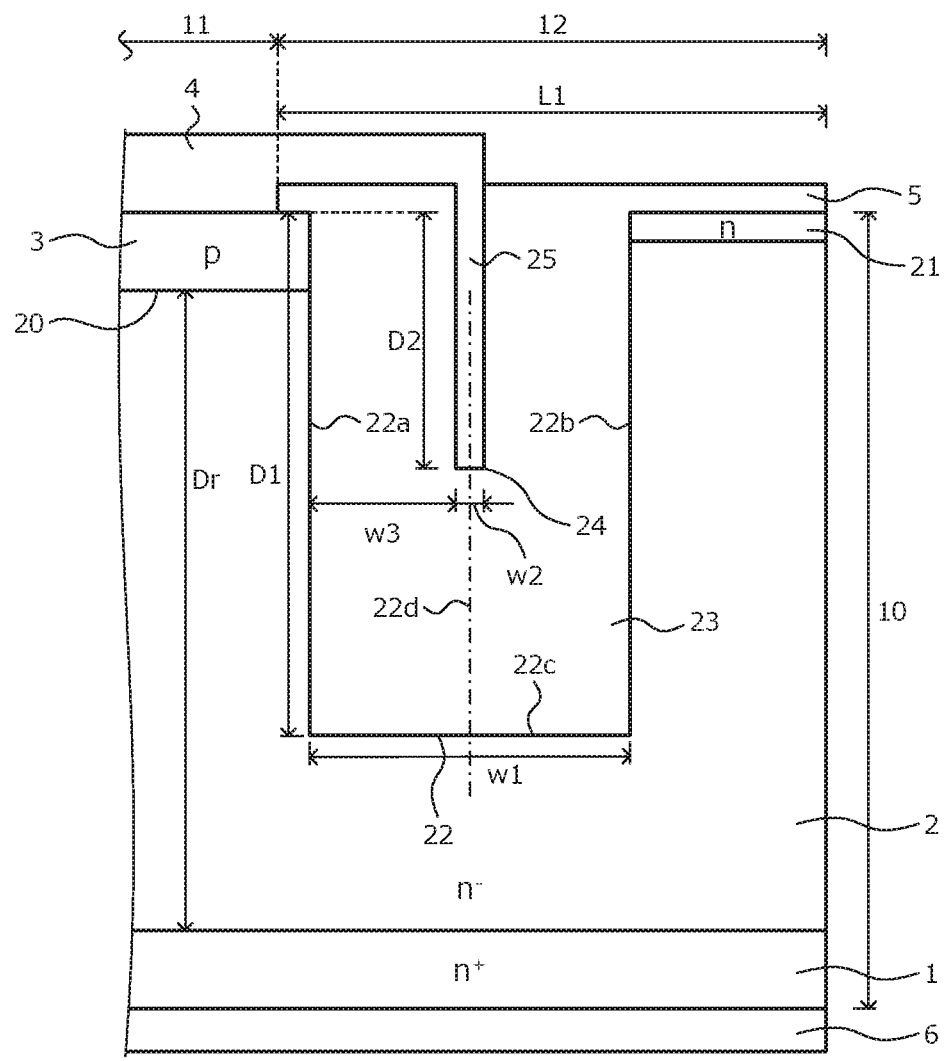
FIG. 1 is a cross sectional view of a structure of an edge termination region of a semiconductor device according to a first embodiment.

Preferred embodiments of a semiconductor device and a method of manufacturing the semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described.

A structure of an edge termination region of the semiconductor device according to a first embodiment will be described. FIG. 1 is a cross sectional view of a structure of the edge termination region of the semiconductor device according to the first embodiment. FIG. 1 depicts the structure from a vicinity of an interface of an active region 11 and an edge termination region 12 to the chip end (similarly for FIGS. 2 to 9, 14 to 25, and 29 to 34). The semiconductor device according to the first embodiment and depicted in FIG. 1 has in the edge termination region 12 that surrounds a periphery of the active region 11, a high voltage structure that is formed by an insulating film (hereinafter, embedded insulating film) 23 embedded inside a trench 22 and a field plate (FP) 25 embedded inside the embedded insulating film 23. The active region 11 is a region in which current flows in the ON state.

More specifically, in the active region 11, on a front surface of a semiconductor base (semiconductor substrate (semiconductor chip)) 10, a p-type region 3 is selectively disposed. The semiconductor base 10 is an epitaxial substrate formed by epitaxially growing on a front surface of an n$^+$-type supporting substrate 1, an n$^-$-type semiconductor layer that becomes an n$^-$-type drift region 2. The surface of an n$^-$-type drift region 2 side of the semiconductor base 10 is assumed as a front surface (base front surface) and a surface of an n$^+$-type supporting substrate 1 side of the semiconductor base 10 (back surface of the n$^+$-type supporting substrate 1) is assumed as a back surface (base back surface). The front surface of the semiconductor base 10 is covered by an interlayer insulating film 5. A front surface electrode 4 contacts the p-type region 3 via a contact hole that penetrates the interlayer insulating film 5 in a direction of depth. The front surface electrode 4 extends outwardly (a chip end side) on the interlayer insulating film 5 and the embedded insulating film 23. A back surface electrode 6 is disposed in the entire back surface of the semiconductor base 10.

When a diode, for example, is formed in the active region 11, the n$^+$-type supporting substrate 1, the p-type region 3, the front surface electrode 4, and the back surface electrode 6 are a cathode region, an anode region, an anode electrode, and a cathode electrode, respectively. Further, when a metal oxide semiconductor field effect transistor (MOSFET), for example, is formed in the active region 11, the n$^+$-type supporting substrate 1, the p-type region 3, the front surface electrode 4, and the back surface electrode 6 are a drain region, base region, source electrode, and a drain electrode, respectively. FIG. 1 depicts among one or more unit cells (element functional units) arranged in the semiconductor base 10, the p-type region 3 configuring an outermost unit cell.

In the edge termination region 12, at the chip end, an n-type channel stopper region 21 is disposed in a surface layer of the front surface of the semiconductor base 10. The n-type channel stopper region 21 is exposed at a chip side surface and an outer side wall (second side wall) 22b of the trench 22 described hereinafter. Further, the n-type channel stopper region 21 is covered by the interlayer insulating film 5. The interlayer insulating film 5 is, for example, a low temperature oxide (LTO) film, etc. The n-type channel stopper region 21 may be covered by, for example, a passivation film (not depicted) of a silicon nitride (SiNx) film and the like.

The trench 22 is disposed at a depth D1 that does not reach the n+-type supporting substrate 1 in a direction of depth from the base front surface. The trench 22 is preferably disposed at a position near the interface with the active region 11. Further, the trench 22 is disposed to have a planar layout surrounding a periphery of the active region 11. At an inner side wall 22a (the active region 11 side, first side wall) of the trench 22, the p-type region 3 that extends from the active region 11 is exposed and contacts the embedded insulating film 23. In other words, an outer end of a pn junction (hereinafter, main junction) 20 between the p-type region 3 that is outermost in the active region 11 and the n−-type drift region 2 terminates at the trench 22 and does not substantially curve. Therefore, electric field concentration at the outer end of the main junction 20 of the active region 11 does not occur. When the depth D1 and a width w1 of the trench 22 are optimized, breakdown voltage of the same level as the theoretical value of the maximum breakdown voltage obtained by the main junction 20 of the active region 11 can be obtained.

The depth D1 of the trench 22, for example, is favorably 30% or more of a thickness Dr of the n−-type drift region 2 (30%≤D1/Dr<100%), and is preferably 50% or more and 80% or less of the thickness Dr of the n−-type drift region 2, whereby high voltage breakdown can be achieved (50%≤D1/Dr≤80%). The width w1 of the trench 22, irrespective of the voltage breakdown rating, is about 30% or more and 60% or less of the depth D1 of the trench 22, whereby high voltage breakdown can be achieved (30%≤w1/D1≤60%). The depth D1 of the trench 22 is a depth from the front surface of the semiconductor base 10. The thickness Dr of the n−-type drift region 2 is a length from the interface of the p-type region 3 and the n−-type drift region 2, to an interface of the n−-type drift region 2 and the n+-type supporting substrate 1.

More specifically, for example, in the case of breakdown voltage of 600V, the thickness Dr of the n−-type drift region 2 is about 50 μm. Therefore, the depth D1 of the trench 22 is about 35 μm (D1/Dr=70%), and the width w1 of the trench 22 is about 15 μm (w1/D1≈43%). For example, in a case of breakdown voltage of 1200V, the thickness Dr of the n−-type drift region 2 is about 140 μm. Therefore, the depth D1 of the trench 22 is about 70 μm (D1/Dr=50%), and the width w1 of the trench 22 is about 31 μm (w1/D1≈44%).

The insulating film (embedded insulating film) 23 is embedded inside the trench 22. The insulating material of the embedded insulating film 23 may be, for example, Spin on Glass (SOG), Benzocyclobutene (BCB), etc. Inside the embedded insulating film 23, a groove 24 is disposed to a depth D2 that does not reach a bottom 22c of the trench 22, in a direction of depth from the base front surface. The groove 24, for example, is disposed at a position (hereinafter, center position of the trench 22) 22d that is substantially ½ of the width w1 of the trench 22, and has a planar layout that surrounds the periphery of the active region 11. The FP 25 is embedded inside the groove 24. In other words, the FP 25 is disposed inside the embedded insulating film 23 to have a length in a direction of depth (vertical direction).

The depth D2 (hereinafter, the depth of the FP 25) of the groove 24 is deeper than the depth of the p-type region 3. Further, the depth D2 of the groove 24, for example, is favorably about 30% or more and 70% or less of the depth D1 of the trench 22 (30%≤D2/D1≤70%), and preferably, about 40% or more and 60% or less the depth D1 of the trench 22, whereby high breakdown voltage can be achieved (40%≤D2/D1≤60%). More specifically, for example, in the case of breakdown voltage of 600V, as described above, since the depth D1 of the trench 22 is about 35 μm, the depth D2 of the groove 24 is about 15 μm (D2/D1≈43%). For example, in the case of withstand voltage of 1200V, as described above, since the depth D1 of the trench 22 is about 70 μm, the depth D2 of the groove 24 is about 40 μm (D2/D1=57%). The depth D2 of the groove 24 is a depth from the front surface of the semiconductor base 10, to the bottom of the groove 24.

The width w2 of the groove 24 is sufficiently narrow with respect to the width w1 of the trench 22 and, for example, is about 1 μm. A distance w3 between the FP 25 and the inner side wall 22a of the trench 22 is wider than the width w2 of the groove 24 (w3>w2). The wider the distance w3 is between the FP 25 and the inner side wall 22a of the trench 22, the greater the electric field load can be increased at a portion of the embedded insulating film 23, between the inner side wall 22a of the trench 22 and the FP 25. As a result, the electric field near an end of the active region 11 (interface of the active region 11 and the edge termination region 12) can be relaxed, enabling the breakdown voltage to be enhanced.

Thus, by disposing the FP 25 inside the embedded insulating film 23, electric field distribution near the FP 25 is modulated. As a result, similar to a case of a superjunction (SJ) structure, an effect can be obtained in that during reverse biasing, the breakdown voltage can be maintained. Therefore, with respect to the main junction 20 of the active region 11, even higher breakdown voltage can be realized. A superjunction structure is a structure where the drift layer is a parallel pn layer in which n-type regions and p-type regions are alternately disposed in a horizontal direction (direction parallel to the substrate primary surface of the substrate) repeatedly. Further, since charge (surface charge) at an interface of the interlayer insulating film 5 and the semiconductor base 10, the surface of the interlayer insulating film 5, etc. is shielded by the FP 25, property changes with respect to the surface charge are reduced.

Figure 36:
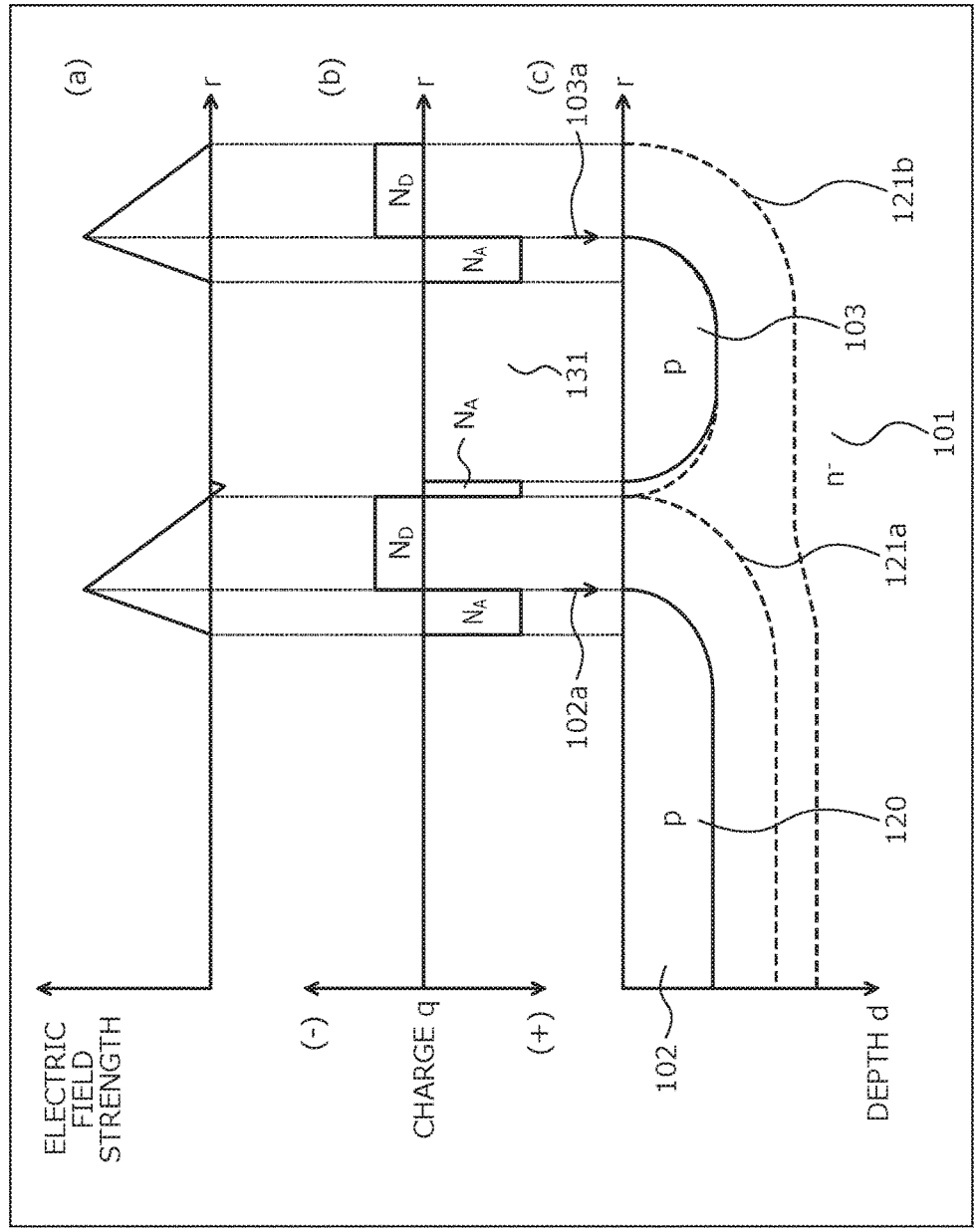
FIG. 36 is a diagram depicting a principle of operation at the edge termination region of a conventional semiconductor device.

Further, disposal of the FP 25 that is long in a vertical direction enables a length (width) L1 of the edge termination region 12 to be greatly reduced as compared to the conventional structure equipped with the FLR 103 (refer to FIG. 36). For example, in the case of breakdown voltage of 600V, the length L1 of the edge termination region of the present invention is about 30 μm in contrast to about 250 μm for a length L100 of the edge termination region of the conventional structure. For example in the case of breakdown voltage of 1200V, the length L1 of the edge termination region of the present invention is about 60 μm in contrast to about 500 μm for the length L100 of the edge termination region of the conventional structure.

The FP 25 is connected to the front surface electrode 4 extending on the embedded insulating film 23. More specifically, the front surface electrode 4 extends outwardly so as to cover entirely an end (end of the base front surface side) on the FP 25. Preferably, the front surface electrode 4 covers a top end of the FP 25 entirely and further extends slightly outward. The reason for this is that during patterning of the front surface electrode 4, the top end of the FP 25 can be prevented from being removed by etching.

Figure 2:
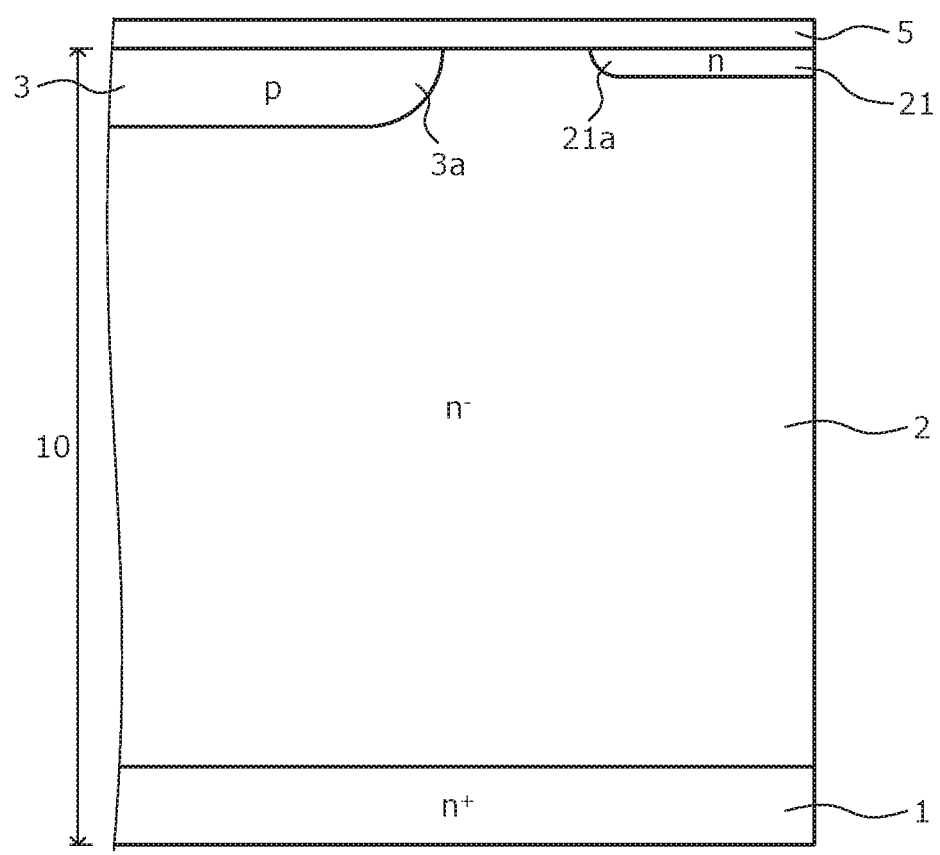
FIG. 2 is a cross sectional view of the semiconductor device according to the first embodiment, during manufacture.

The method of manufacturing the semiconductor device according to the first embodiment will be described taking the production (manufacture) of a diode as an example. FIGS. 2 to 9 are cross sectional views of the semiconductor device according to the first embodiment, during manufacture. As depicted in FIG. 2, in the front surface of the n$^+$-type supporting substrate 1 becoming the cathode region, an n$^-$-type semiconductor layer that becomes the n$^-$-type drift region 2 is epitaxially grown. As a result, the semiconductor base (semiconductor wafer) 10 is formed where the n$^-$-type drift region 2 is epitaxially grown on the n$^+$-type supporting substrate 1.

Next, a process combining photolithography, impurity implantation, and resist mask removal is repeatedly performed under different conditions, and a predetermined region is selectively formed on the front surface side (surface of the n$^-$-type drift region 2 side) of the semiconductor base 10. The predetermined region is the n-type channel stopper region 21, an anode region (the p-type region 3) configuring an element structure of the active region 11, and the like. Next, in the entire front surface of the semiconductor base 10, an LTO film, for example, is formed as the interlayer insulating film 5. Next, impurities implanted inside the semiconductor base 10 are activated by heat treatment.

Figure 3:
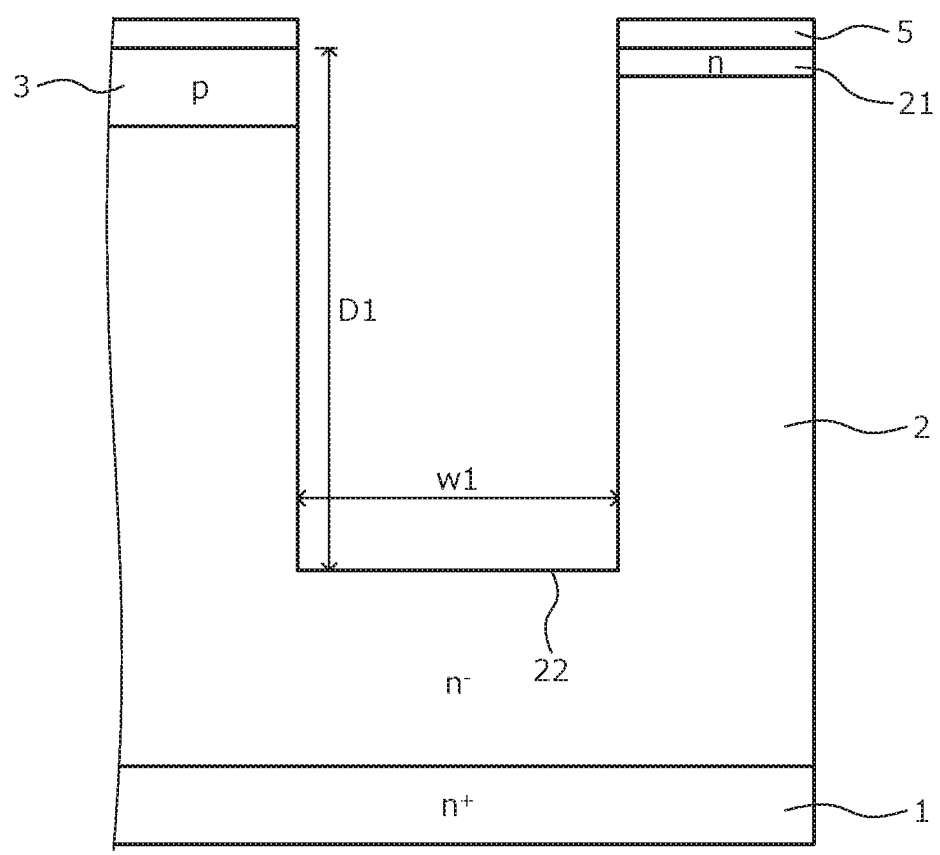
FIG. 3 is a cross sectional view of the semiconductor device according to the first embodiment, during manufacture.

As depicted in FIG. 3, by photolithography and etching, a resist mask (not depicted) is formed in which a portion corresponding to a forming region of the trench 22 is opened. Next, using the resist mask as a mask, the interlayer insulating film 5 is patterned. Next, after the resist mask is removed, the interlayer insulating film 5 is used as a mask to perform etching and the trench 22 is formed having the depth D1 and the width w1. Here, the trench 22 is formed to penetrated in a direction of depth, an outer end 3a (refer to FIG. 2) of the outermost p-type region 3 and an inner end 21a of the n-type channel stopper region 21 (refer to FIG. 2).

Figure 4:
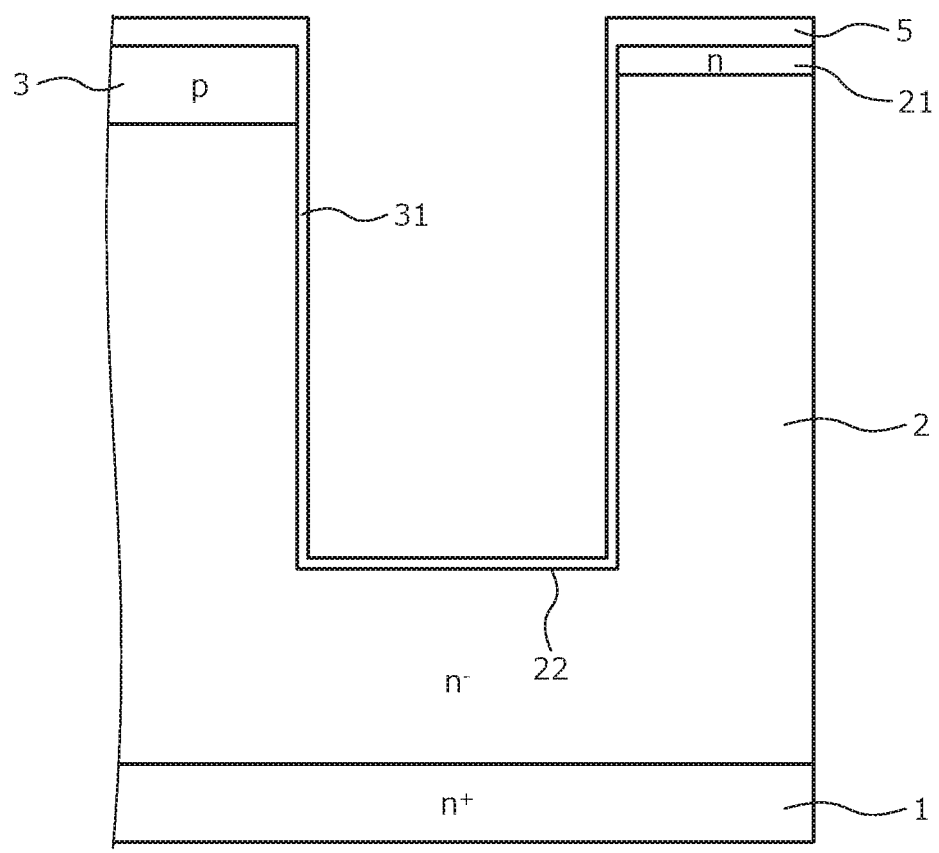
FIG. 4 is a cross sectional view of the semiconductor device according to the first embodiment, during manufacture.
Figure 5:
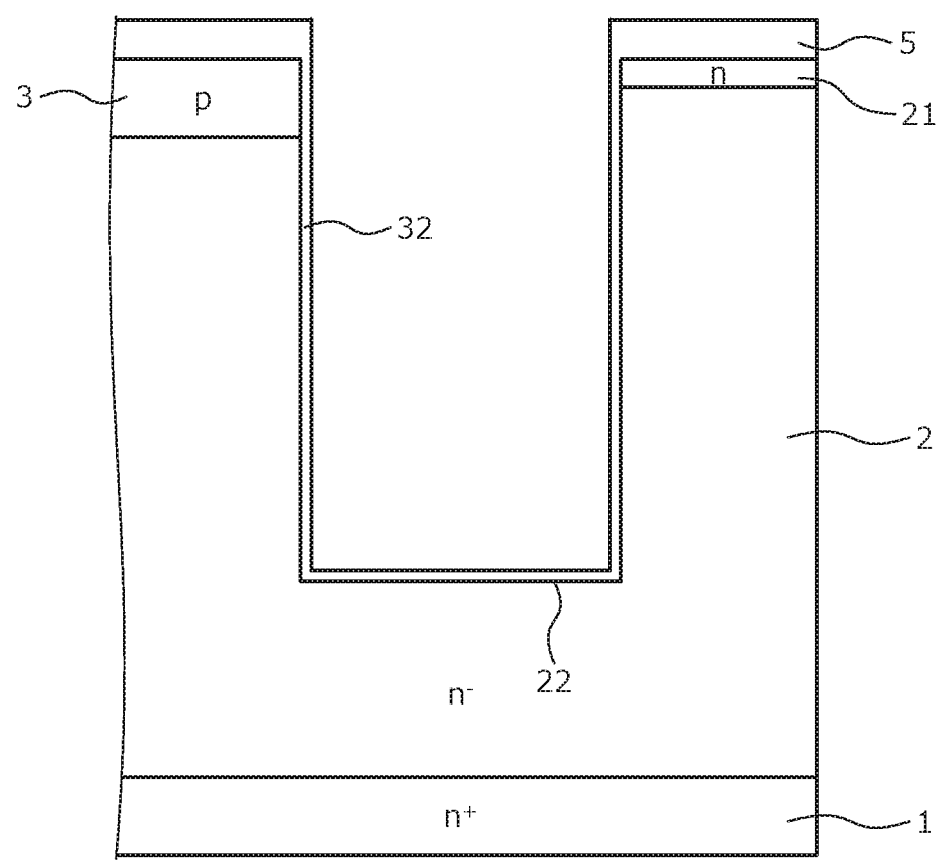
FIG. 5 is a cross sectional view of the semiconductor device according to the first embodiment, during manufacture.

Next, as depicted in FIG. 4, after a sacrificial oxide film 31 is formed along interior walls of the trench 22, the sacrificial oxide film 31 is removed. As a result, an interface state between a semiconductor region exposed after sacrificial oxidation of the interior walls of the trench 22 and an LTO film 32 formed at a subsequent process can be reduced. Next, as depicted in FIG. 5, the LTO film 32 is deposited (formed), for example, along the interior walls of the trench 22 and the base front surface. Next, defects in the LTO film 32 are reduced by heat treatment. The thickness of the interlayer insulating film 5 becomes thick consequent to deposition of the LTO film 32.

By making the interlayer insulating film 5 thick, adverse effects of the surface charge can be reduced during operation of the semiconductor device. The surface charge is the charge at the interface of the interlayer insulating film 5 and the semiconductor base 10, in the surface of the interlayer insulating film 5, etc. Further, the interlayer insulating film 5 becomes a polishing stopper film to stop polishing when the embedded insulating film 23 formed at a subsequent process is polished and planarized. Therefore, by making the interlayer insulating film 5 thick, the process margin when the embedded insulating film 23 is polished can be increased, enabling the embedded insulating film 23 to be prevented from becoming thinner that a predetermined thickness.

Figure 6:
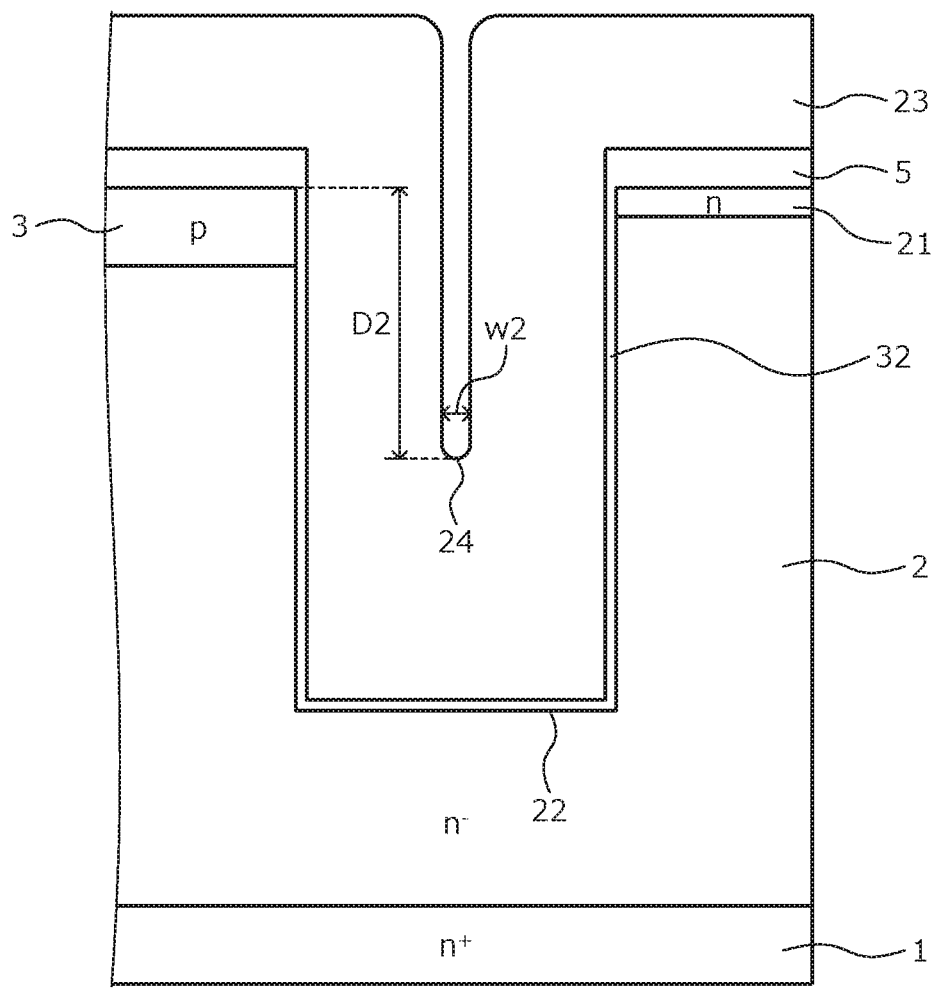
FIG. 6 is a cross sectional view of the semiconductor device according to the first embodiment, during manufacture.

Next, as depicted in FIG. 6, the embedded insulating film 23 is deposited along the interior walls of the trench and the base front surface. Here, the interior of the trench 22 is not completely embedded with the embedded insulating film 23 and the embedded insulating film 23 is embedded so as to leave inside the trench 22, the groove 24 of the depth D2 and the width w2 and having a cross sectional shape that is substantially linear. More specifically, for example, insulating material of the embedded insulating film 23 suffices to be applied to the base front surface by a depositing method or spin coat method. Next, the embedded insulating film 23 is hardened by heat treatment (curing).

Figure 7:
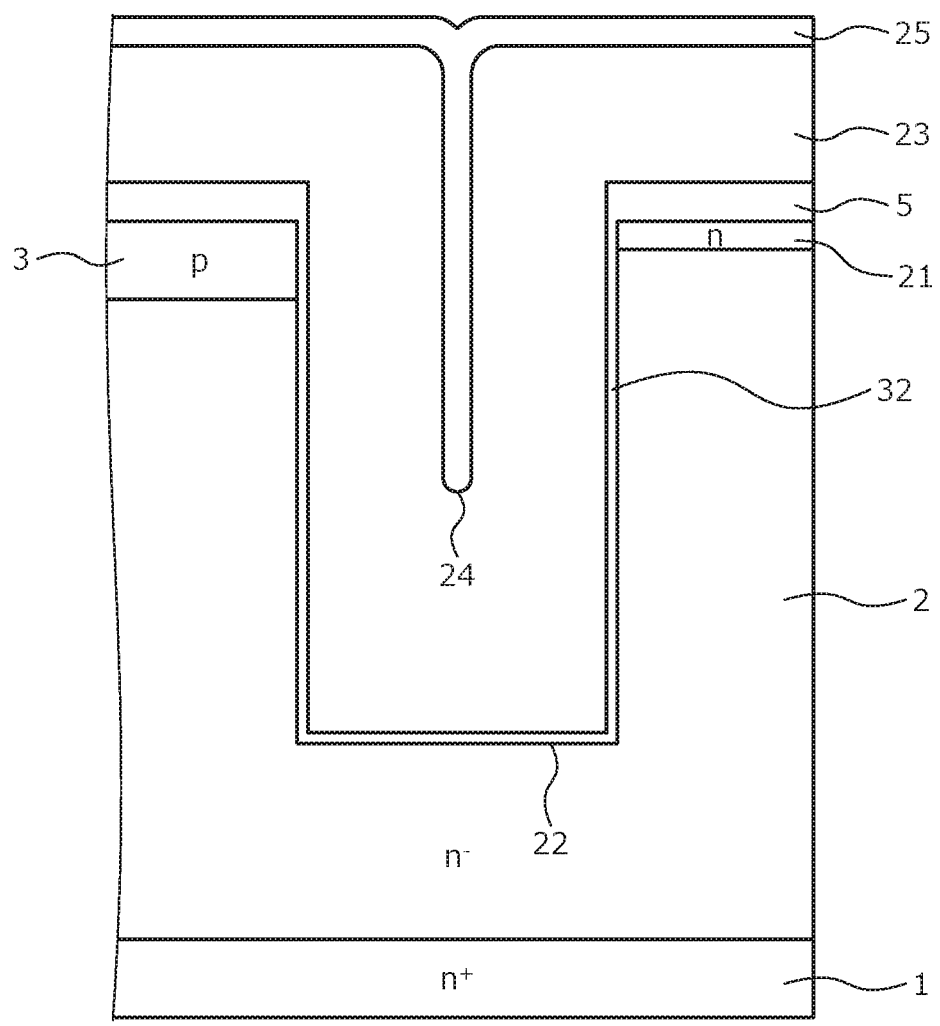
FIG. 7 is a cross sectional view of the semiconductor device according to the first embodiment, during manufacture.
Figure 8:
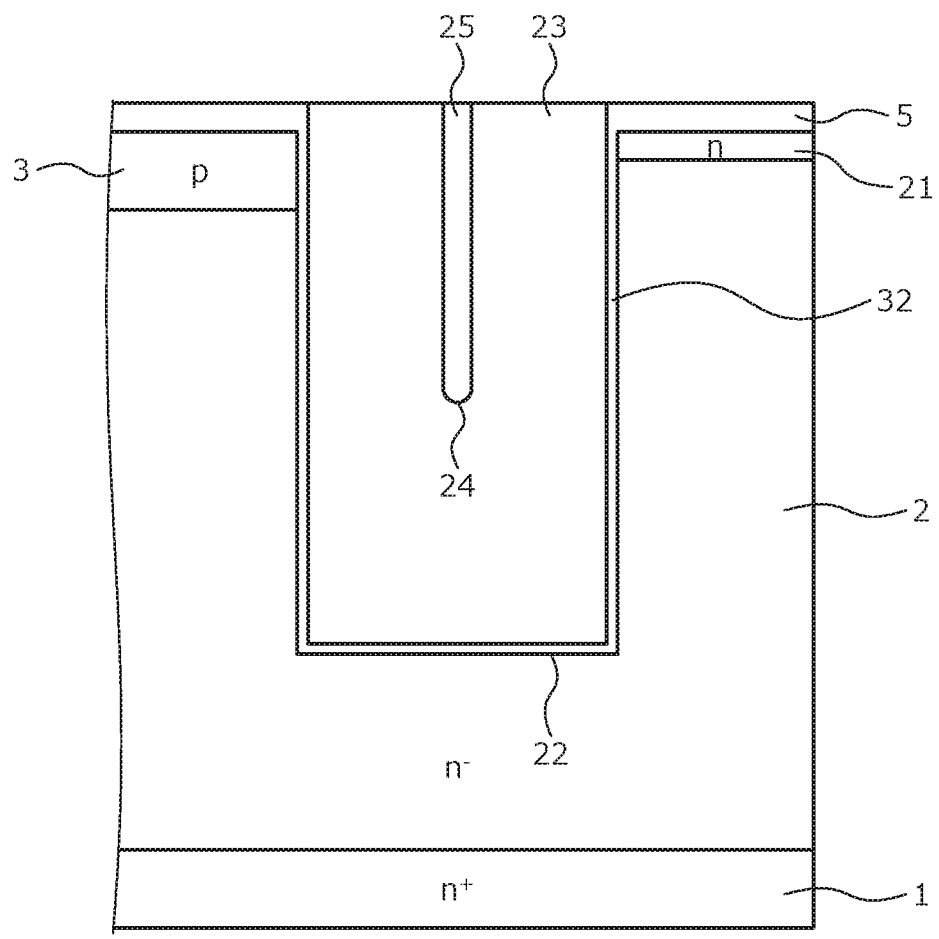
FIG. 8 is a cross sectional view of the semiconductor device according to the first embodiment, during manufacture.
Figure 9:
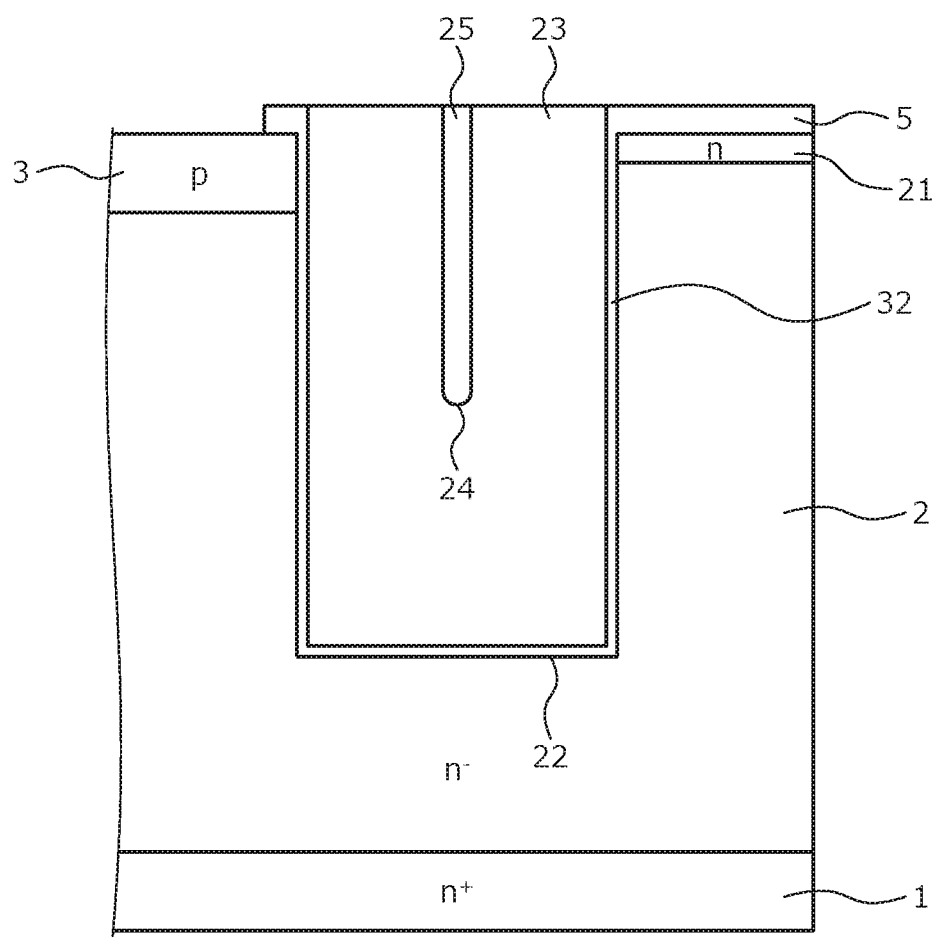
FIG. 9 is a cross sectional view of the semiconductor device according to the first embodiment, during manufacture.

Next, as depicted in FIG. 7, the FP 25 formed by, for example, an aluminum (Al) film is deposited on the embedded insulating film 23 so as to be embedded inside the groove 24. Next, as depicted in FIG. 8, the FP 25 and the embedded insulating film 23 are polished until the interlayer insulating film 5 is exposed. As a result, the FP 25 remains only inside the groove 24 of the embedded insulating film 23. Next, as depicted in FIG. 9, the interlayer insulating film 5 is patterned, a contact hole is formed, and the p-type region 3 is exposed by the contact hole.

Next, after forming the front surface electrode 4, which is formed by an aluminum film, on the entire base front surface so as to be embedded in the contact hole, the front surface electrode 4 is patterned. Here, the front surface electrode 4 is left so as to cover entirely the active region 11 and at a portion extending outward, to at least cover entirely the top end the FP 25. The back surface electrode 6 is formed on the entire back surface (the back surface of the n$^+$-type supporting substrate 1) of the semiconductor base 10. Thereafter, the semiconductor wafer is diced into chips (dicing), forming singular units, whereby the semiconductor device depicted in FIG. 1 is completed.

Figure 10:
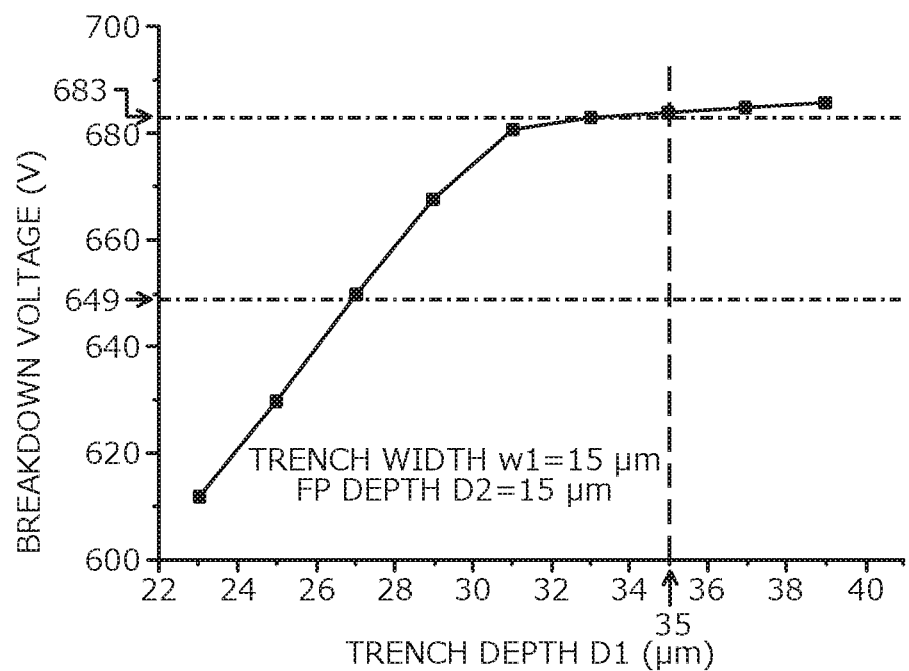
FIG. 10 is a graph depicting the relationship between trench depth of first examples and breakdown voltage.

The relationship between the depth D1 of the trench 22 and breakdown voltage was verified. FIG. 10 is a graph depicting the relationship between trench depth of first examples and breakdown voltage. In FIG. 10, the horizontal axis represents the depth (trench depth) D1 of the trench 22 and the vertical axis represents breakdown voltage of the semiconductor device when the main junction 20 of the active region 11 is reverse biased. Samples (hereinafter, first examples) for which the depth D1 of the trench 22 differed were produced according to the method of manufacturing the semiconductor device according to the first embodiment described above. In each of the first examples, the width (trench width) w1 of the trench 22 was 15 µm. The depth D2 of the groove 24 (in FIG. 10, indicated as the FP depth D2) was 15 µm.

For the first examples, the results of breakdown voltage measurement for each semiconductor device are depicted in FIG. 10. Further, in FIG. 10, theoretical value (=683V) of the maximum breakdown voltage that can be obtained by the main junction 20 of the active region 11 of the first examples and breakdown voltage that is 95% of theoretical value (≈649V) are respectively depicted by dotted-dashed horizontal lines. From the results depicted in FIG. 10, it was confirmed that the deeper the depth D1 of the trench 22 is, the higher the breakdown voltage is. Further, it was confirmed that by setting the depth D1 of the trench 22 to 35 µm or greater, high breakdown voltage can be achieved that is greater than or equal to the maximum breakdown voltage theoretically obtainable by the main junction 20 of the active region 11.

Figure 11:
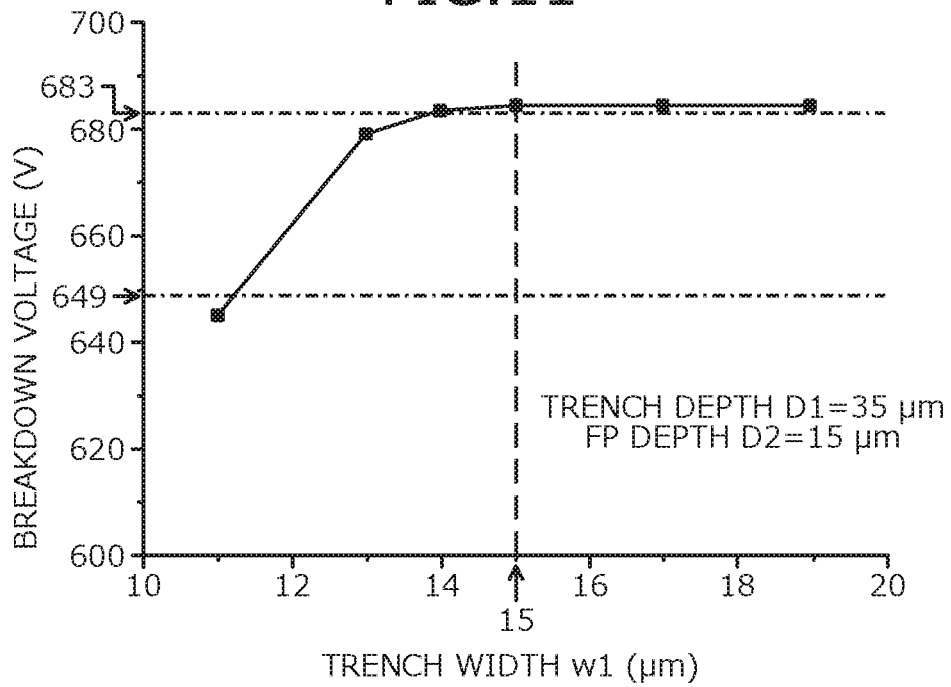
FIG. 11 is a graph depicting the relationship between second examples and breakdown voltage.

Next, the relationship between the width w1 of the trench 22 and breakdown voltage was verified. FIG. 11 is a graph depicting the relationship between second examples and breakdown voltage. In FIG. 11, the horizontal axis represents the width (trench width) w1 of the trench 22 and the vertical axis represents breakdown voltage of the semiconductor device when the main junction 20 of the active region 11 is reverse biased. Samples (hereinafter, second examples) for which the width w1 of the trench 22 differed were produced according to the method of manufacturing the semiconductor device according to the first embodiment described above. In each of the second examples, the depth (trench depth) D1 of the trench 22 was 35 μm. The depth D2 of the groove 24 (in FIG. 11, indicated as FP depth D2) was 15 μm.

For the second examples, the results of breakdown voltage measurement for each semiconductor device are depicted in FIG. 11. Further, in FIG. 11, theoretical value (=683V) of the maximum breakdown voltage that can be obtained by the main junction 20 of the active region 11 of the second examples and breakdown voltage that is 95% of theoretical value (≈649V) are respectively depicted by dotted-dashed horizontal lines. From the results depicted in FIG. 11, it was confirmed that the wider the width w1 of the trench 22 is, the higher the breakdown voltage is. Further, it was confirmed that by setting the width w1 of the trench 22 to 15 μm or greater, high breakdown voltage can be achieved that is greater than or equal to the maximum breakdown voltage theoretically obtainable by the main junction 20 of the active region 11.

Figure 12:
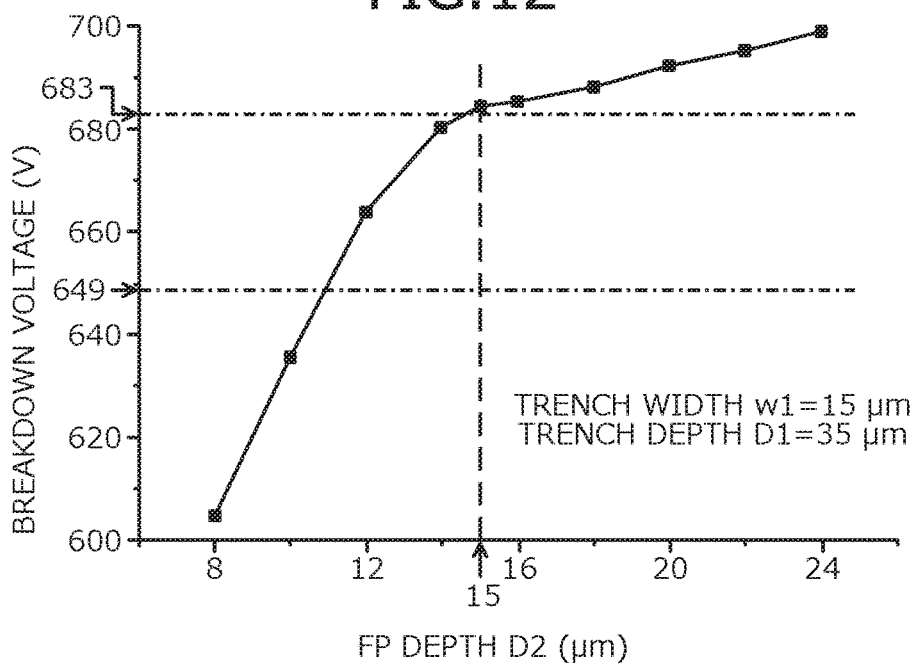
FIG. 12 is a graph depicting the relationship between groove depth of third examples and breakdown voltage.

Next, the relationship between the depth D2 of the groove 24 (the depth of the FP 25) and breakdown voltage was verified. FIG. 12 is a graph depicting the relationship between groove depth of third examples and breakdown voltage. In FIG. 12, the horizontal axis represents the depth D2 of the groove 24 (in FIG. 12, indicated as FP depth D2) and the vertical axis represents breakdown voltage of the semiconductor device when the main junction 20 of the active region 11 is reverse biased. Samples (hereinafter, third examples) for which the depth D2 of the groove 24 differed were produced according to the method of manufacturing the semiconductor device according to the first embodiment described above. In each of the third examples, the width (trench width) w1 of the trench 22 was 15 μm. The depth (trench depth) D1 of the trench 22 was 35 μm.

For the third examples, the results of breakdown voltage measurement for each semiconductor device are depicted in FIG. 12. Further, in FIG. 12, theoretical value (=683V) of the maximum breakdown voltage that can be obtained by the main junction 20 of the active region 11 of the second examples and breakdown voltage that is 95% of theoretical value (≈649V) are respectively depicted by dotted-dashed horizontal lines. From the results depicted in FIG. 12, it was confirmed that the deeper the depth D2 of the groove 24 is, the higher the breakdown voltage is. Further, it was confirmed that by setting the depth D2 of the groove 24 to 15 μm or greater, high breakdown voltage can be achieved that is greater than or equal to the maximum breakdown voltage theoretically obtainable by the main junction 20 of the active region 11.

Figure 13:
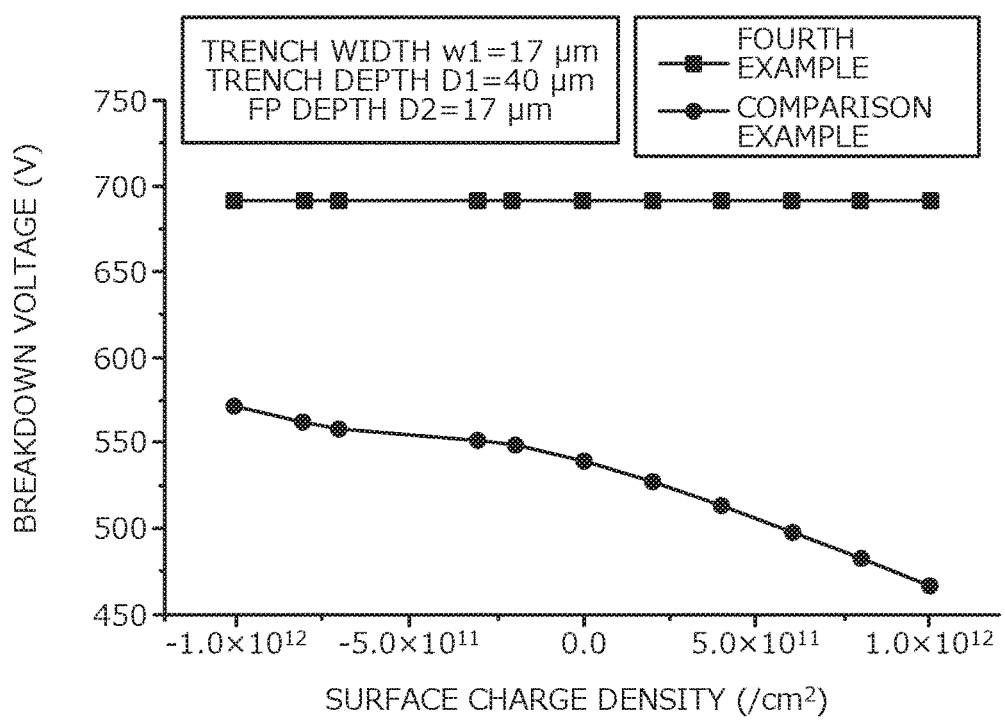
FIG. 13 is a graph depicting breakdown charge of a fourth example.

Next, breakdown charge by the presence/absence of the FP 25 was verified. FIG. 13 is a graph depicting breakdown charge of a fourth example. In FIG. 13, the horizontal axis represents surface charge density and the vertical axis represents breakdown voltage of the semiconductor device when the main junction 20 of the active region 11 is reverse biased. A Sample (hereinafter, fourth example) was produced according to the method of manufacturing the semiconductor device according to the first embodiment described above. In the fourth example, the width (trench width) w1 of the trench 22 was 17 μm. The depth (trench depth) D1 of the trench 22 was 40 μm and the depth D2 of the groove 24 (in FIG. 13, indicated as FP depth D2) was 17 μm.

For the fourth example, surface charge density was varied and semiconductor device the results of breakdown voltage measurement for each semiconductor device are depicted in FIG. 13. FIG. 13 further depicts breakdown voltage of a semiconductor device (hereinafter, comparison example) in which the FP in the edge termination region is not disposed, when surface charge density is varied. The width of the edge termination region of the comparison example was the same as that of the fourth example. From the results depicted in FIG. 13, it was confirmed that in the comparison example, the more positive charge increases, the greater breakdown voltage decreases. In contrast, it was confirmed that in the fourth example, irrespective of surface charge density, the breakdown voltage was about the same.

As described above, according to the first embodiment, by disposing the trench of a wide width in the edge termination region, embedding the embedded insulating film, and terminating at an interior wall of the trench, the end of the main junction of the active region, electric field near the end of the active region can be relaxed. As a result, breakdown voltage can be obtained that is greater than or equal to the maximum breakdown voltage theoretically obtainable by the main junction of the active region. Further, since no FLR is disposed in the edge termination region, the width of the edge termination region can be greatly reduced as compared to the conventional structure in which FLRs are disposed. Further, according to the first embodiment, by disposing inside the embedded insulating film, the FP that is sufficiently narrower than the trench width and long in a vertical direction, the electric field distribution can be modulated to contain inside the embedded insulating film, locations where electric field concentrates. As a result, breakdown voltage can be obtained that is greater than or equal to the maximum breakdown voltage theoretically obtainable by the main junction of the active region. Further, according to the first embodiment, by disposing the FP inside the embedded insulating film, tolerance of overvoltage can be increased. Therefore, when overvoltage is applied, current occurring consequent to avalanche breakdown equally flows in the active region. Further, the FP disposed inside the embedded insulating film has a function of shielding surface charge. Consequently, adverse effects of the surface charge can be reduced. Therefore, breakdown voltage and breakdown charge can be enhanced.

The semiconductor base 10 of the present embodiment is not limited to the n$^+$-type supporting substrate 1 and epitaxial substrate. For example, the semiconductor base 10 may be a bulk wafer cut from an ingot. The ingot for the bulk wafer may be manufactured by a float zone (FZ) method, a Czochralski (CZ) process, or a magnetic Czochralski (MCZ) process. The semiconductor base 10 may be, for example, a bulk wafer that has been thinned by grinding the back surface side thereof. In this case, the n$^-$-type drift region 2 may be of the same impurity concentration as the bulk wafer. An n-type high impurity concentration layer corresponding to the n$^+$-type supporting substrate 1 may be formed by introducing an n-type dopant (phosphorus, arsenic, etc.) into the ground surface by ion implantation, etc., and thermal annealing, etc. A thinning process of the semiconductor base 10 may be performed after formation of surface structures such as the FP, the embedded insulating film, and the trench of the present embodiment.

Figure 14A:
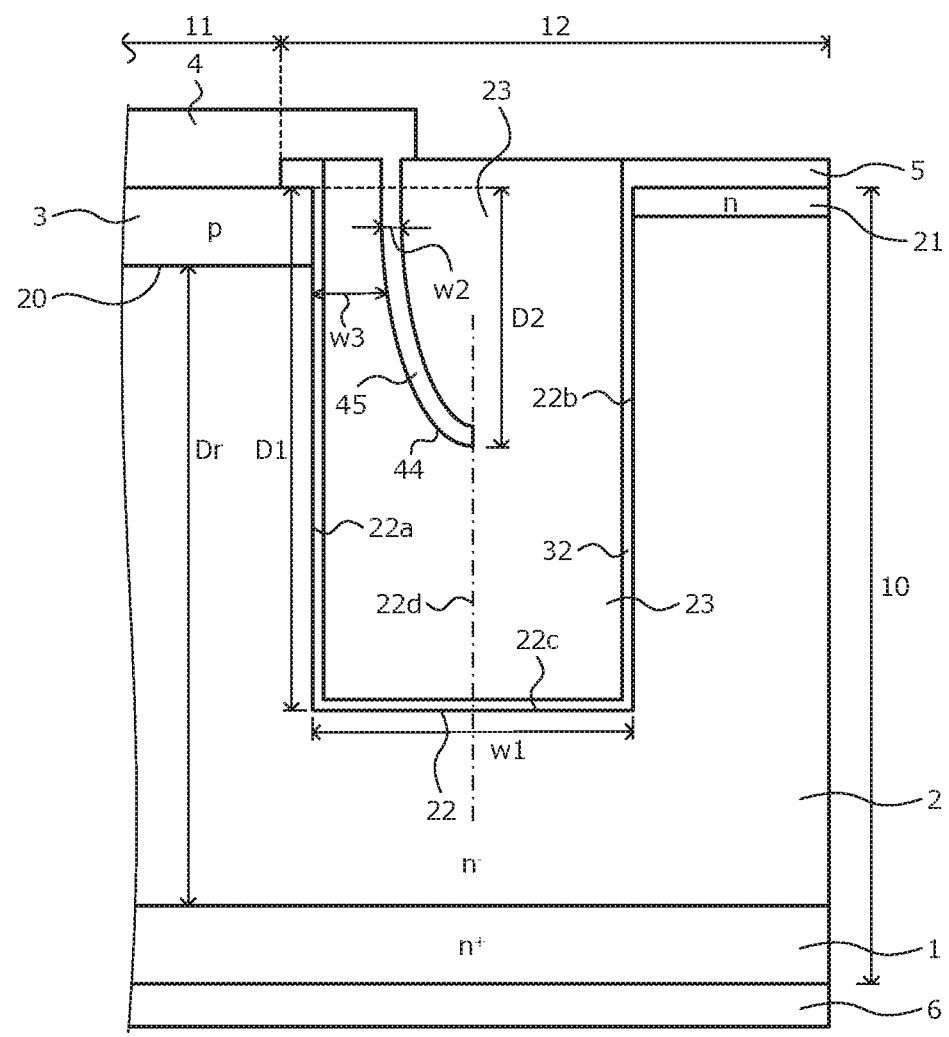
FIG. 14A is a cross sectional view of a structure of the semiconductor device according to a second embodiment.
Figure 14B:
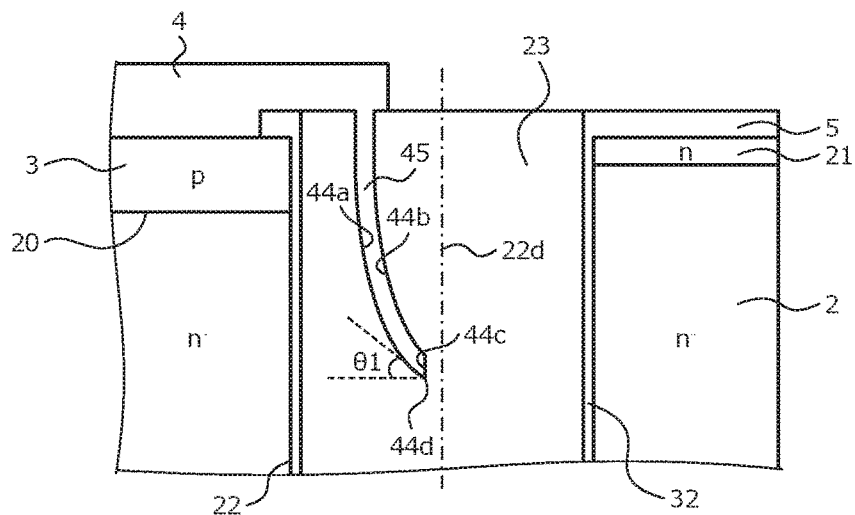
FIG. 14B is a cross sectional view of the structure of the semiconductor device according to the second embodiment.

A structure of the semiconductor device according to a second embodiment will be described. FIGS. 14A and 14B are cross sectional views of a structure of the semiconductor device according to the second embodiment. The semiconductor device according to the second embodiment differs from the semiconductor device according to the first embodiment in that the distance w3 between a FP 45 and the inner side wall 22a of the trench 22 progressively increases with the depth from the base front surface. In other words, the FP 45 curves outwardly away from the inner side wall 22a of the trench 22 as the depth from the base front surface increases.

More specifically, the FP 45, similar to the first embodiment, is embedded inside a groove 44 disposed in the embedded insulating film 23. Both side walls 44a, 44b of the groove 44 curve away from the inner side wall 22a of the trench 22 as the depth from the base front surface increases. At least near a bottom end of the FP 45, the distance w3 between the FP 45 and the inner side wall 22a of the trench 22 is greater than the width w2 of the groove 24. Although the electric field strength of the embedded insulating film increases with the depth from the base front surface, at a portion where the electric field strength near the bottom end of the FP 45 is high, the thickness (the width in a horizontal direction) of the embedded insulating film 23 becomes thick, and the effect of relaxing the electric field at this thickened portion of the embedded insulating film 23 becomes enhanced.

Further, disposal of the FP 45 enables electric field distribution to be obtained such that corresponding to the curve of the FP 45, locations where electric field concentrates are moved farther outward within the interior the embedded insulating film 23. In other words, the FP 45 has a function of modulating the electric field distribution such that locations where electric field concentrates are contained inside the embedded insulating film 23. The farther outward the locations where electric field concentrates are positioned inside the embedded insulating film 23, the greater the breakdown voltage is enhanced by relaxing the electric field of the portion of the n$^-$-type drift region 2, along the inner side wall 22a of the trench 22.

More specifically, an angle θ1 of the base front surface and a tangent passing through an inner corner portion 44d of a bottom 44c of the groove 44 is 0 degrees or greater and less than 90 degrees (0 degrees≤θ1<90 degrees). The inner corner portion 44d of the bottom 44c of the groove 44 is positioned at the center position 22d of the trench 22 (i.e., corresponding to a case where θ1=0 degrees: refer to FIG. 14A), or, farther inward than the center position 22d of the trench 22 (i.e., corresponding to a case where 0 degrees<θ1<90 degrees: refer to FIG. 14B). The inner corner portion 44d of the bottom 44c of the groove 44 is an intersecting line of the bottom 44c of the groove 44 and the inner side wall 44a.

Preferably, the FP 45 curves outwardly to an extent enabling the electric field strength of the portion of the n$^-$-type drift region 2, along the inner side wall 22a of the trench 22 to be lower than the electric field strength near the main junction 20 of the active region 11. For example, the angle θ1 of the base front surface and the tangent passing through the inner corner portion 44d of the bottom 44c of the groove 44 is favorably 20 degrees or greater and 70 degrees or less (20 degrees≤θ1≤70 degrees) and is preferably, 30 degrees or greater and 60 or less (30 degrees≤θ1≤60 degrees). A case where θ1=90 degrees is a state where the side wall of the groove is not curved and corresponds to the first embodiment.

The depth D2 of the groove 44 is identical to that of the first embodiment. In the second embodiment, the depth D2 of the groove 44 is a length in a vertical direction, from the front surface of the semiconductor base 10, to the inner corner portion 44d of the bottom 44c of the groove 44. The width w2 of the groove 44 is substantially constant from the base front surface to the bottom 44c of the groove 44. The end of the front surface electrode 4 is preferably positioned farther inward than a position of the bottom end of the FP 45 (end on base back surface side) in a horizontal direction. The reason for this is that when the front surface electrode 4 extends farther outward than the position of the bottom end of the FP 45 in a horizontal direction, electric field distribution is adversely affected by the FP 45. The bottom end of the FP 45 is a portion of the FP 45 at the inner corner portion 44d of the bottom 44c of the groove 44.

Figure 15:
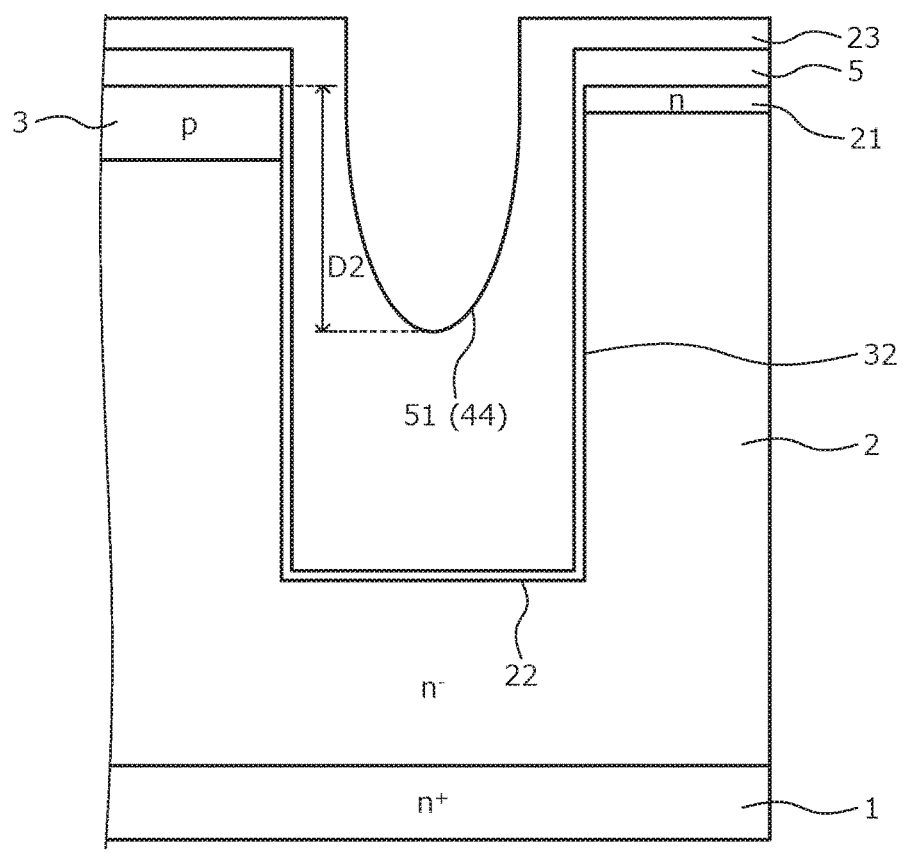
FIG. 15 is a cross sectional view of the semiconductor device according to the second embodiment, during manufacture.

The method of manufacturing the semiconductor device according to the second embodiment will be described. FIGS. 15 to 20 are cross sectional views during manufacture of the semiconductor device according to the second embodiment. Similar to the first embodiment, the n$^+$-type supporting substrate 1 is prepared and processes from epitaxial growth of the n$^-$-type drift region 2 to deposition of the LTO film 32 are sequentially performed (refer to FIGS. 2 to 5). Next, as depicted in FIG. 15, the embedded insulating film 23 is deposited along the base front surface and along the inner wall of the trench 22. Here, the interior of the trench 22 is not completely embedded with the embedded insulating film 23 and the embedded insulating film 23 is embedded so as to leave a groove 51 having a cross sectional shape that is substantially a U-shape inside the trench 22. The groove 51 later becomes the groove 44 in which the FP 45 is embedded. Therefore, the groove 51 is left at the depth D2 from the interface of the p-type region 3 and the n$^-$-type drift region 2.

More specifically, by a spin coat method, the insulating material of the embedded insulating film 23 is applied to the base front surface while rotating the semiconductor base 10 about an axis. Here, adjustment of the thickness of the embedded insulating film 23 by adjusting the rotating speed of the stage on which the semiconductor base 10 is placed, enables the cross sectional shape (slope of the side wall) of the groove 51 and the depth D2 to be adjusted. An application-type insulating material that is viscous and has high fluidity such as SOG and BCB described above is used as the insulating material of the embedded insulating film 23. The reason for this is that with insulating material deposited by a deposition method, etc., the groove 51 cannot be left to have a cross section that is substantially a U-shape.

Figure 16:
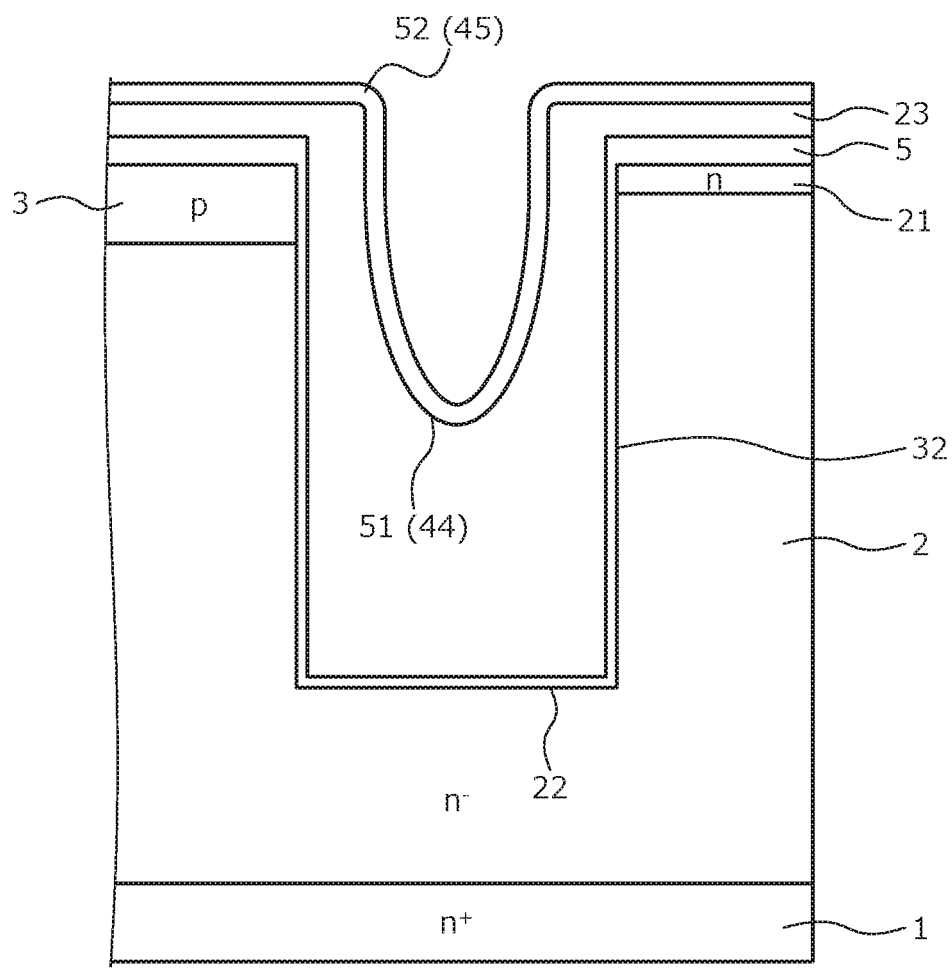
FIG. 16 is a cross sectional view of the semiconductor device according to the second embodiment, during manufacture.

Next, as depicted in FIG. 16, after hardening of the embedded insulating film 23 by heat treatment, a metal film 52 that becomes the FP 45 is deposited along the inner wall of the groove 51. The metal film 52 is, for example, an aluminum film. The aluminum film easily reflects irradiated light for luminous exposure during photolithography to form a resist mask used for patterning the metal film 52. Therefore, next, the metal film 52 is covered by a metal film (hereinafter, reflection preventing film) that prevents reflection. The reflection preventing film may be, for example, a deposited metal film of a titanium-tungsten (TiW) film and a silicon nitride (SiN) film, sequentially deposited.

Next, for example, a resist film is applied onto the reflection preventing film by a deposition method or a spray coat method. Application of the resist film by a spray coat method enables the resist film to be formed along the reflection preventing film. Next, the resist film is patterned (luminous exposure of resist film) by photolithography and a resist mask that covers the forming region of the FP 45 is formed. When the resist film is luminously exposed, in an opening of the resist film, the reflection preventing film is luminously exposed; and the lower layer thereof, the metal film 52, is not luminously exposed. Therefore, unintended luminous exposure of a portion (a portion to be left as the resist mask) of the resist film by light that is irradiated for luminous exposure and reflected by the metal film 52 does not occur.

Figure 17:
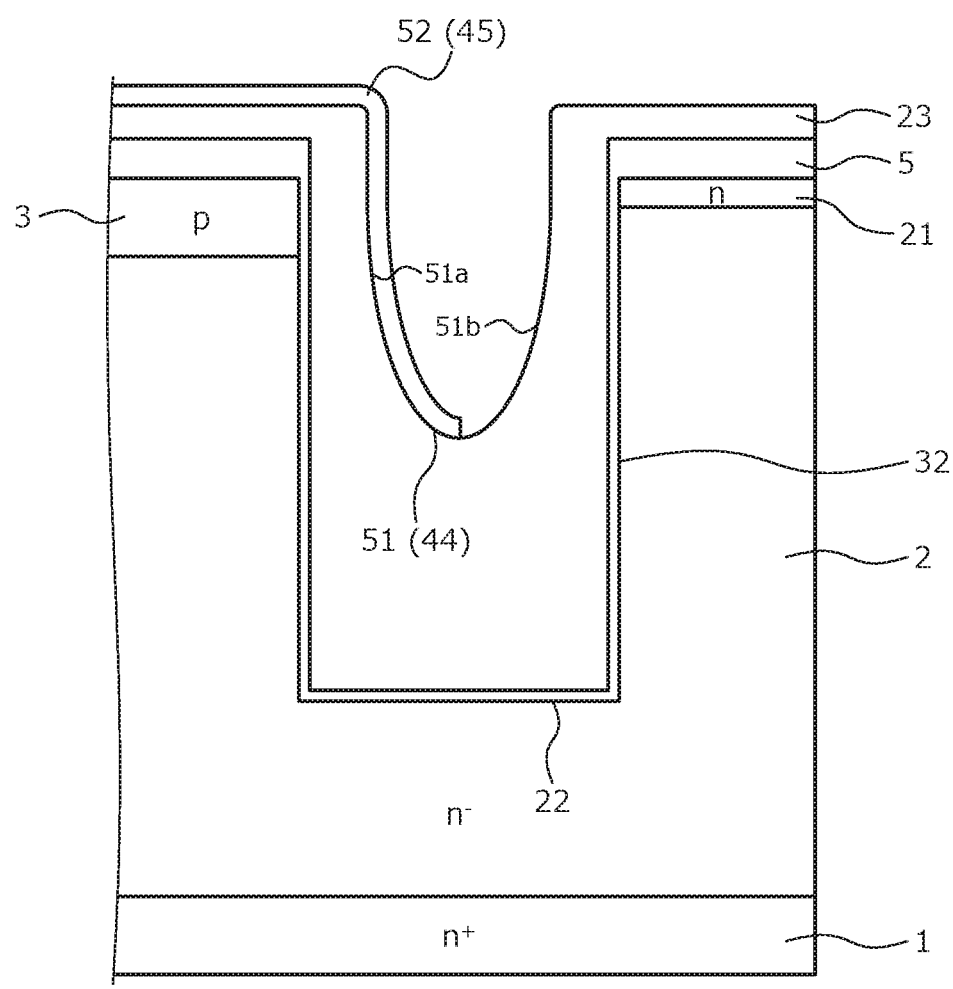
FIG. 17 is a cross sectional view of the semiconductor device according to the second embodiment, during manufacture.

Next, as depicted in FIG. 17, etching is performed using the resist mask (not depicted) as a mask, and the metal film 52 and the reflection preventing film (not depicted) are patterned. For example, a portion of the metal film 52, from a portion covering an outer side wall (second side wall) 51b of the groove 51 outward, is removed, and a portion from a portion covering an inner side wall (first side wall) 51a of the groove 51 inward, is left. The metal film 52 left on the inner side wall 51a of the groove 51 becomes the FP 45. Next, the resist mask is removed, followed by the reflection preventing film. The reason for removing the reflection preventing film is that a contact unit (contact) of the FP 45, contacting the front surface electrode 4 is preferably formed by the same metal material as the front surface electrode 4.

Figure 18:
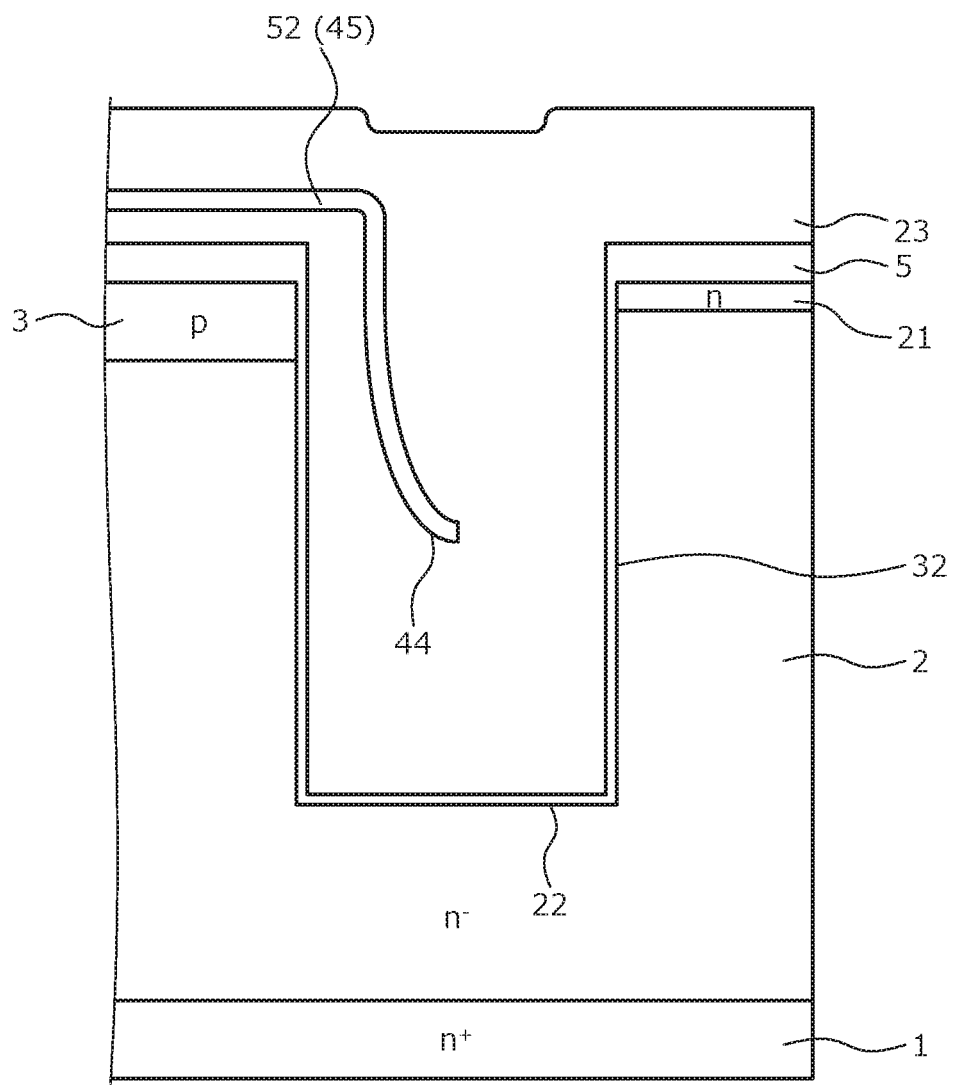
FIG. 18 is a cross sectional view of the semiconductor device according to the second embodiment, during manufacture.
Figure 19:
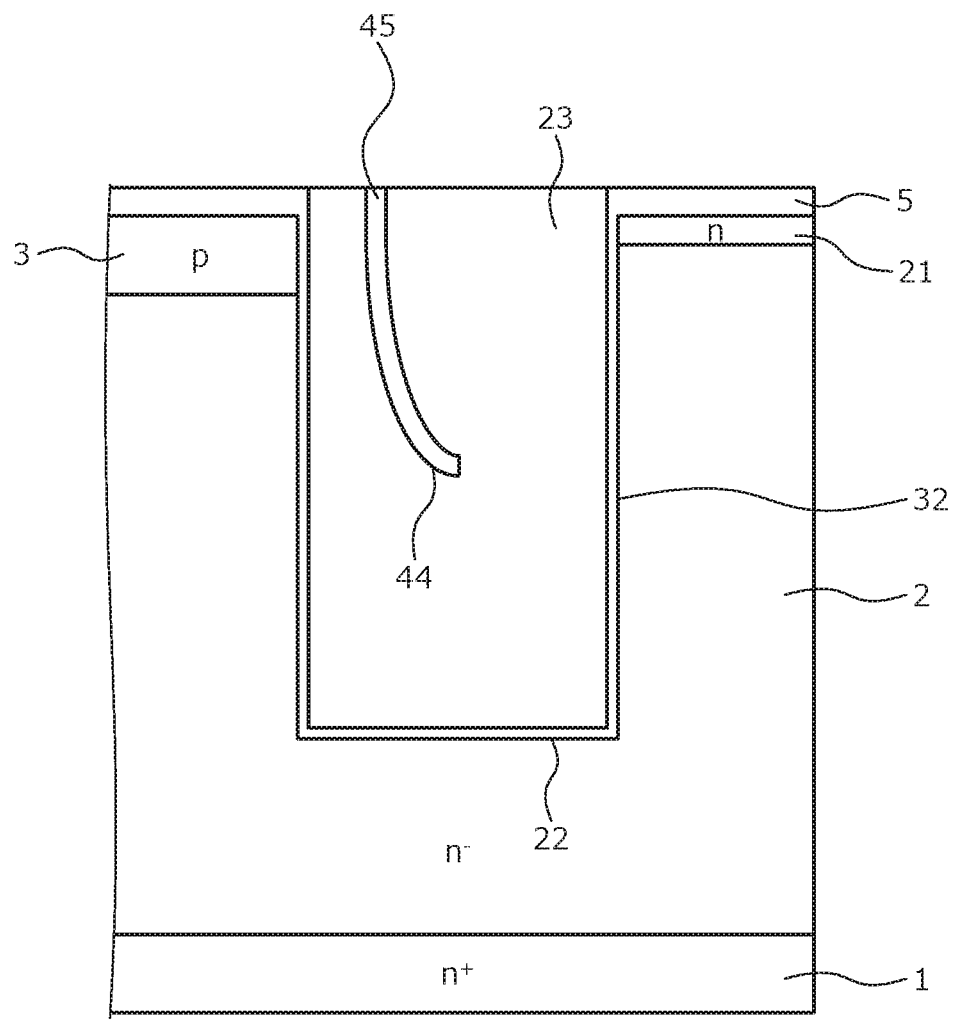
FIG. 19 is a cross sectional view of the semiconductor device according to the second embodiment, during manufacture.
Figure 20:
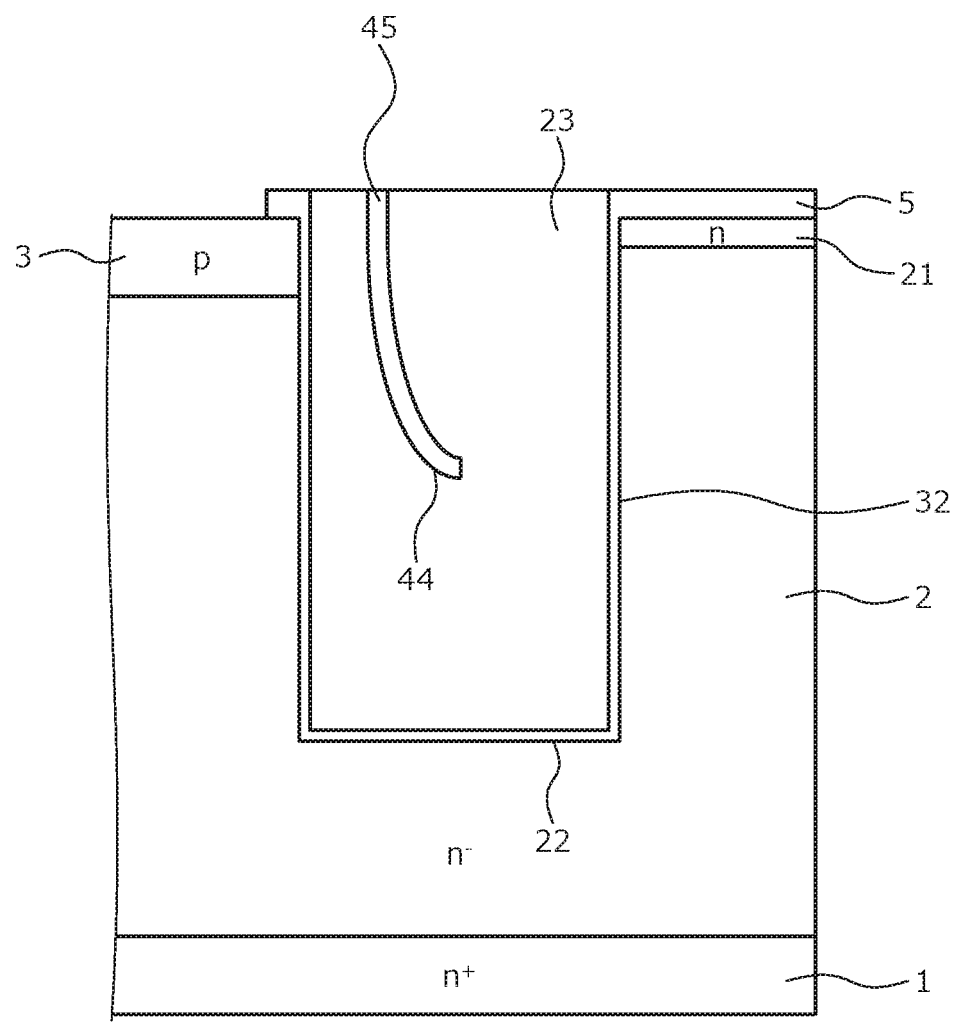
FIG. 20 is a cross sectional view of the semiconductor device according to the second embodiment, during manufacture.

Next, as depicted in FIG. 18, after completely embedding the interior of the trench 22 with the embedded insulating film 23, the embedded insulating film 23 is hardened by heat treatment. As a result, the groove 44 in which the FP 45 is embedded is formed. Next, as depicted in FIG. 19, the FP 45 and the embedded insulating film 23 are polished until the interlayer insulating film 5 is exposed. Next, as depicted in FIG. 20, photolithography and etching are performed to pattern the interlayer insulating film 5 and form a contact hole, exposing the p-type region 3. Thereafter, similar to the first embodiment, formation of the front surface electrode 4 and the processes thereafter are sequentially performed, whereby the semiconductor device depicted in FIG. 14A is completed.

As described above, according to the second embodiment, effects similar to those of the first embodiment can be achieved. Further, according to the second embodiment, by curving the FP inside the embedded insulating film outward as the depth from the base front surface increases, the electric field near the lower end of the FP can be relaxed. As a result, electric field concentration of a portion of the n⁻-type drift region, along the inner side wall of the trench can be reduced and the breakdown voltage can be further enhanced.

Figure 21A:
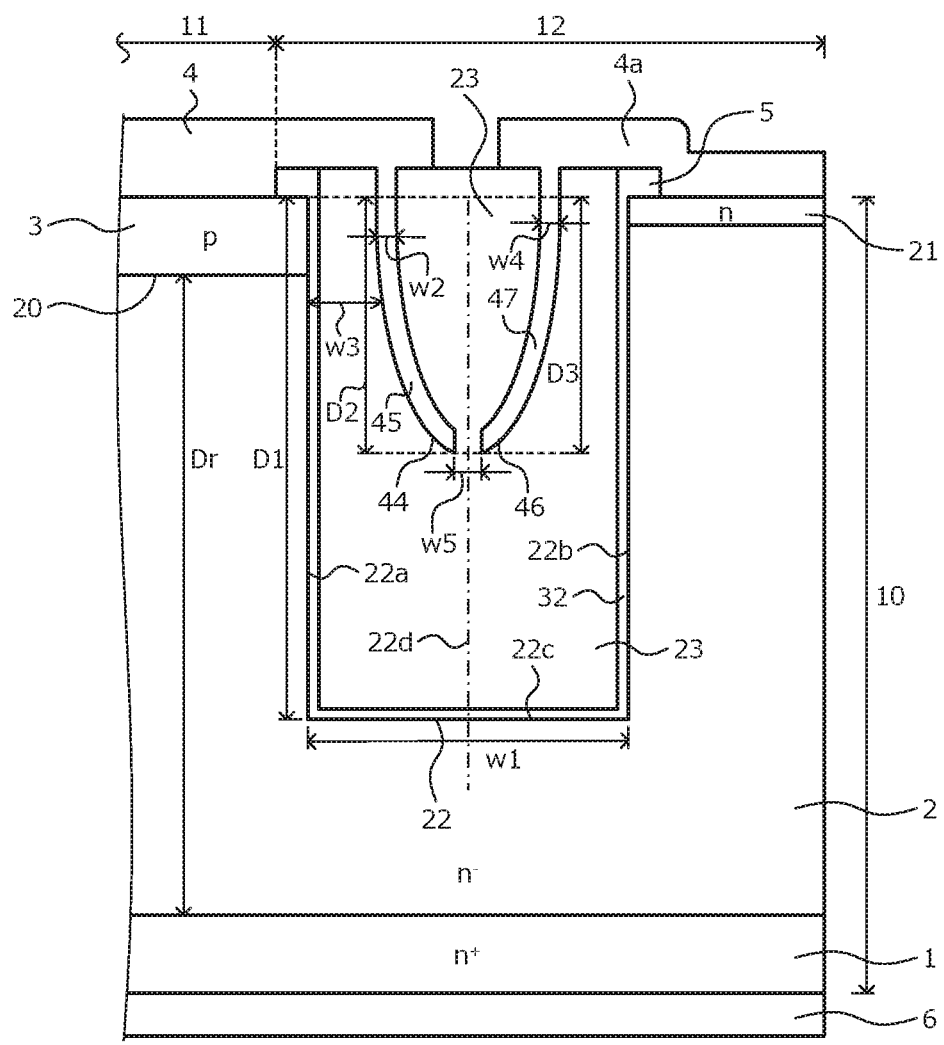
FIG. 21A is a cross sectional view of a structure of the semiconductor device according to a third embodiment.
Figure 21B:
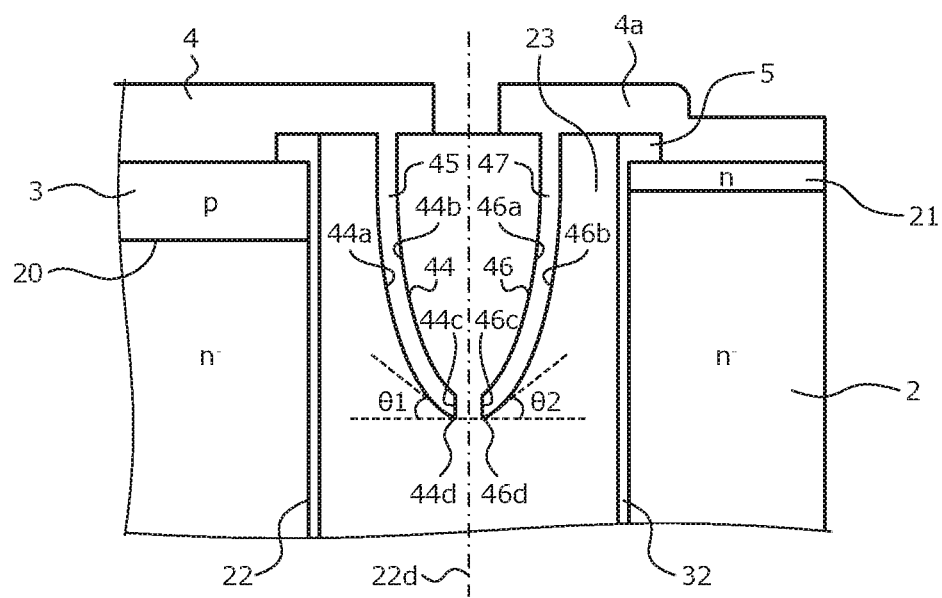
FIG. 21B is a cross sectional view of the structure of the semiconductor device according to the third embodiment.

A structure of the semiconductor device according to a third embodiment will be described. FIGS. 21A and 21B are cross sectional views of a structure of the semiconductor device according to the third embodiment. FIG. 21B depicts an enlarge view of a portion of FIG. 21A. The semiconductor device according to the third embodiment differs from the semiconductor device according to the second embodiment in that inside the embedded insulating film 23, on at outer side of the FP (hereinafter, a first FP) 45, a FP (hereinafter, second FP) 47 is further disposed. The second FP 47 curves inwardly away from the outer side wall 22b of the trench 22 as the depth from the base front surface increases. The second FP 47 is separate from and not electrically connected to the first FP 45. The second FP 47 is electrically connected to the n-type channel stopper region 21.

Disposal of the second FP 47 enables electric field distribution to be obtained such that corresponding to the curve of the second FP 47, locations where electric field concentrates are moved farther inward within the interior of the embedded insulating film 23. As a result, distribution in which locations where electric field concentrates protrude farther outward than the embedded insulating film 23 can be suppressed. In other words, the second FP 47 has a function of suppressing extension of the depletion layer that extends outwardly from the main junction 20 of the active region 11 and a function of adjusting the electric field distribution such that locations where electric field concentrates are contained inside the embedded insulating film 23. As a result, concentration of the electric field in the n-type channel stopper region 21 is suppressed, enabling the occurrence of avalanche breakdown at the n-type channel stopper region 21 to be prevented.

More specifically, the second FP 47 is embedded inside a groove (hereinafter, second groove) 46 disposed in the embedded insulating film 23. The second groove 46 is disposed to have a planar layout surrounding a periphery of a groove (hereinafter, first groove) 44 in which the first FP 45 is embedded. Both side walls 46a, 46b of the second groove 46 curve away from the outer side wall 22b of the trench 22 as the depth from the base front surface increases. With respect to a central line passing through the center position 22d of the trench 22, for example, the second groove 46 may curve to be substantially symmetrical to the first groove 44.

The angle θ1 of the base front surface and a tangent passing through the inner corner portion 44d of the bottom 44c of the first groove 44 is greater than 0 degrees and less than 90 degrees (0 degrees<θ1<90 degrees). The inner corner portion 44d of the bottom 44c of the first groove 44 is positioned farther inward than the center position 22d of the trench 22. The angle θ1 of the base front surface and the tangent passing through the inner corner portion 44d of the bottom 44c of the groove 44 is similar to that in the second embodiment.

An angle θ2 of the base front surface and a tangent that passes through an outer corner portion 46d of a bottom 46c of the second groove 46 is greater than 0 degrees and less than 90 (0 degrees<θ2<90 degrees). The outer corner portion 46d of the bottom 46c of the second groove 46 is an intersecting line of the bottom 46c of the second groove 46 and the outer side wall 46b. The outer corner portion 46d of the bottom 46c of the second groove 46 is positioned farther outward than the center position 22d of the trench 22.

In other words, the bottom 44c of the first groove 44 and the bottom 46c of the second groove 46 do not contact. A distance w5 between the inner corner portion 44d of the bottom 44c of the first groove 44 and the outer corner portion 46d of the bottom 46c of the second groove 46, for example, preferably satisfies expression (1) with respect to breakdown voltage $V_B$ of the semiconductor device and dielectric breakdown voltage $V_C$ of the embedded insulating film 23. The dielectric breakdown voltage $V_C$ of the embedded insulating film 23, for example, is about 2×10⁶V/cm.

$$w5\ [\text{cm}] \geq V_B[V]/V_C[V/\text{cm}] \qquad (1)$$

From expression (1), when the breakdown voltage $V_B$ of the semiconductor device is, for example, 1000V, the distance w5 between the inner corner portion 44d of the bottom 44c of the first groove 44 and the outer corner portion 46d of the bottom 46c of the second groove 46 is about 5 μm. A width w4 of the second groove 46 is substantially constant from the base front surface to the bottom 46c of the second groove 46. The width w4 of the second groove 46 may be substantially equivalent to the width w2 of the first groove 44 (w4=w2).

The depth D2 of the groove 44 is identical to that in the second embodiment. A depth D3 of the second groove 46 can be varied and is favorably a depth that enables the occurrence of avalanche breakdown at the n-type channel stopper region 21 to be prevented and that enables modulation of the electric field distribution to an extent that a depletion layer 63 (refer to FIG. 28) that extends outwardly from the main junction 20 of the active region 11 does not reach the chip end. The depth D3 of the second groove 46 is a length in a vertical direction from the front surface of the semiconductor base 10, to the outer corner portion 46d of the bottom 46c of the second groove 46. FIGS. 21A and 21B depict a case where the depth D2 of the first groove 44 and the depth D3 of the second groove 46 are substantially the same.

The second FP 47 extends on the embedded insulating film 23 and is electrically connected to the n-type channel stopper region 21. More specifically, a stopper electrode 4a is connected to the n-type channel stopper region 21 and covers entirely or at least a portion of the n-type channel stopper region 21 (end on the base front surface side). Furthermore, the stopper electrode 4a extends inwardly from an outer side of the semiconductor substrate so as to cover a portion on the embedded insulating film 23. The second FP 47, at an upper portion, is connected to the stopper electrode 4a. The second FP 47 may be connected farther outward than an inner end of the stopper electrode 4a. Such configuration enables adverse effects of external charge on potential distribution inside the embedded insulating film 23 to be minimized.

The method of manufacturing the semiconductor device according to the third embodiment will be described. FIGS. 22 to 25 are cross sectional views during manufacture of the semiconductor device according to the third embodiment. Similar to the second embodiment, first, the n+-type supporting substrate 1 is prepared and processes from epitaxial growth of the n−-type drift region 2 to deposition of the metal film 52 and the reflection preventing film are sequentially performed (refer to FIGS. 2 to 5, 15, and 16). In the third embodiment, the groove 51 disposed inside the trench 22 becomes the first and the second grooves 44, 46; and the metal film 52 formed along the groove 51 becomes the first and the second FPs 45, 47.

Figure 22:
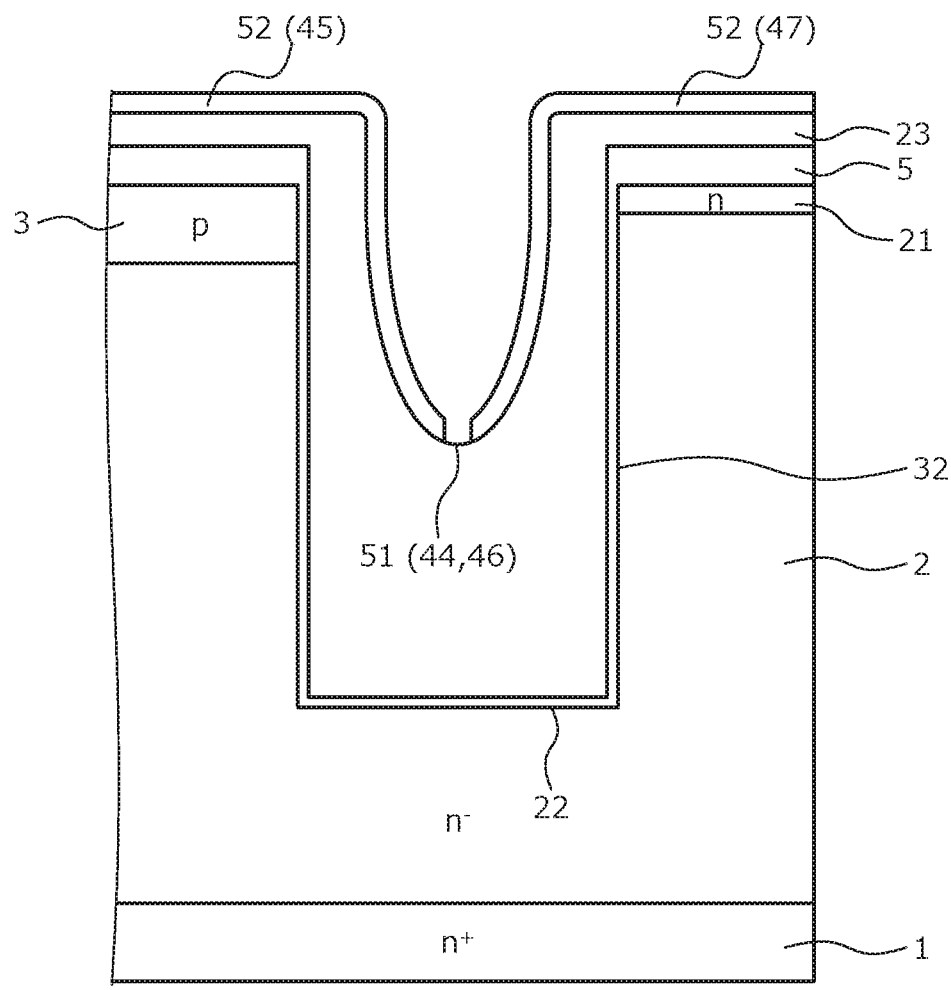
FIG. 22 is a cross sectional view of the semiconductor device according to the third embodiment, during manufacture.
Figure 23:
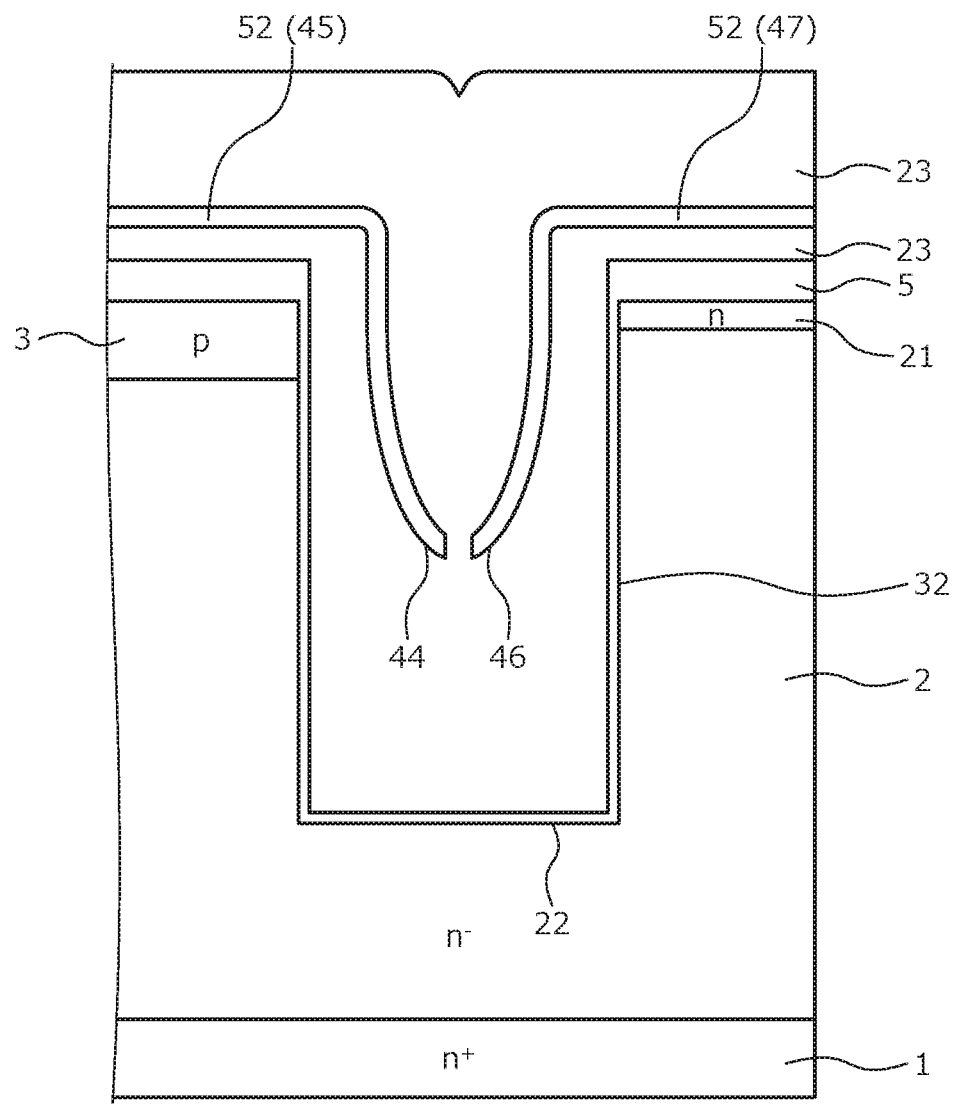
FIG. 23 is a cross sectional view of the semiconductor device according to the third embodiment, during manufacture.

Next, as depicted in FIG. 22, photolithography and etching are performed to pattern the metal film 52 and the reflection preventing film (not depicted), and the portions of the metal film 52 to become the first and the second FPs 45, 47 are left. Next, the resist mask and the reflection preventing film are removed and subsequently, as depicted in FIG. 23, after the interior of the trench 22 is completely embedded with the embedded insulating film 23, the embedded insulating film 23 is hardened by heat treatment. As a result, the first and the second grooves 44, 46 in which the first and the second FPs 45, 47 are respectively embedded are formed.

Figure 24:
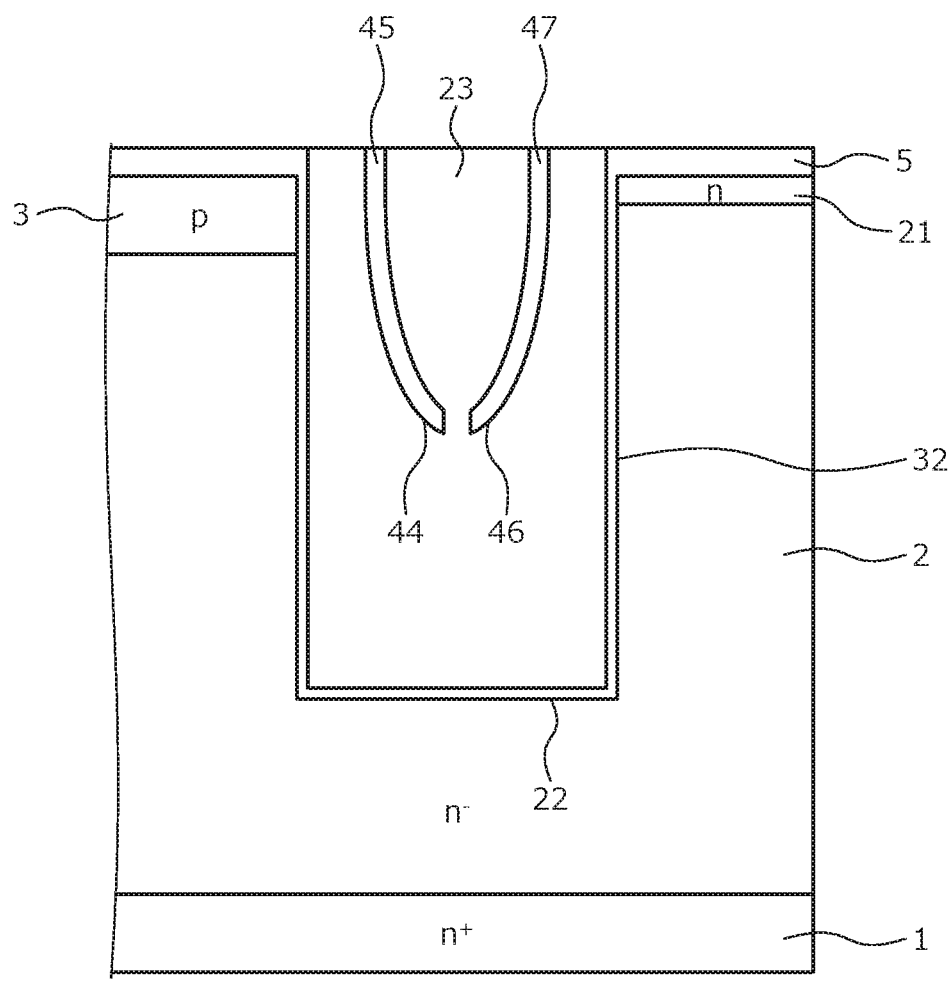
FIG. 24 is a cross sectional view of the semiconductor device according to the third embodiment, during manufacture.
Figure 25:
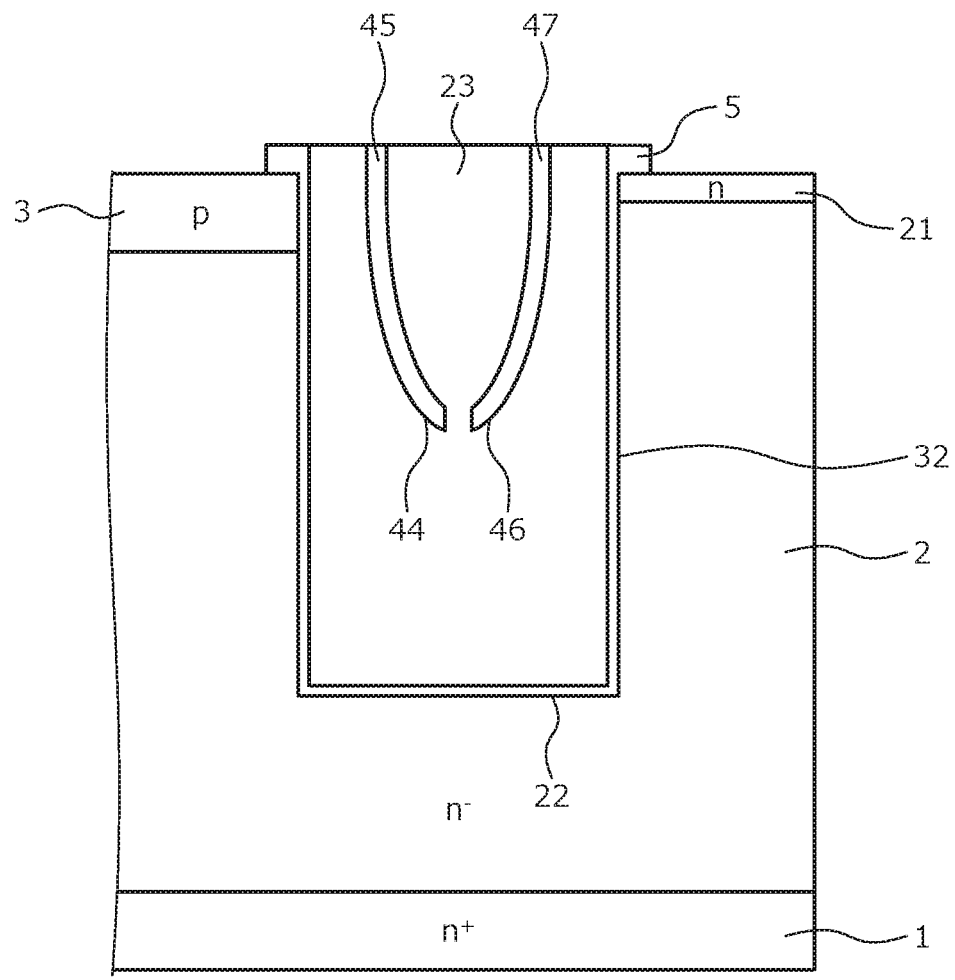
FIG. 25 is a cross sectional view of the semiconductor device according to the third embodiment, during manufacture.

Next, as depicted in FIG. 24, the first and the second FPs 45, 47 and the embedded insulating film 23 are polished until the interlayer insulating film 5 is exposed. Next, as depicted in FIG. 25, photolithography and etching are performed to pattern the interlayer insulating film 5 and form a contact hole, exposing the p-type region 3 and the n-type channel stopper region 21. Thereafter, similar to the second embodiment, formation of the front surface electrode 4 and the processes thereafter are sequentially performed, whereby the semiconductor device depicted in FIGS. 21A and 21B is completed. In the semiconductor device according to the third embodiment, the stopper electrode 4a is formed concurrently with a process of forming the front surface electrode 4 or at a process after formation of the front surface electrode 4.

As described above, according to the third embodiment, effects similar to those of the first and the second embodiments can be achieved. Further, according to the third embodiment, disposal of the second FP that curves inwardly as the depth from the base front surface increases enables electric field distribution to be obtained that contains locations where electric field concentrates, to be in a portion between the first and the second FPs of the embedded insulating films. As a result, the occurrence of avalanche breakdown farther outward than the embedded insulating film can be suppressed.

Figure 26:
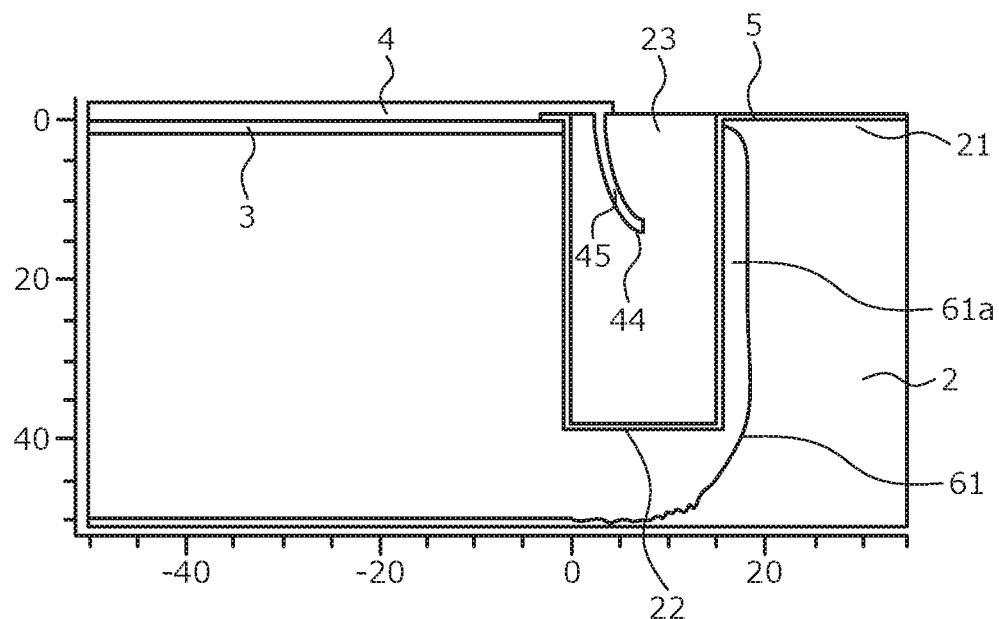
FIG. 26 is a diagram of static characteristics of a fifth example.
Figure 27:
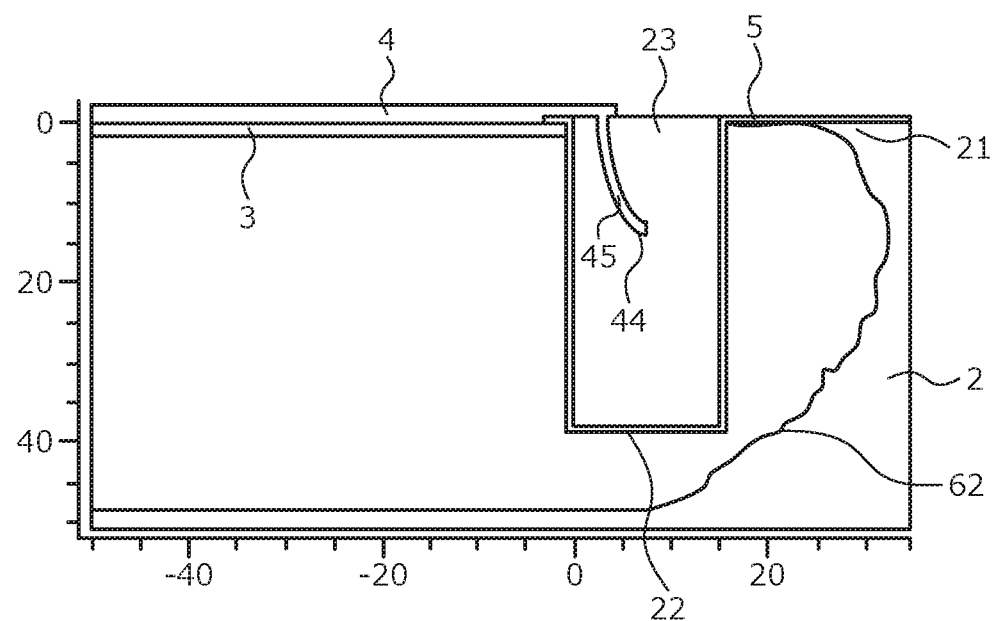
FIG. 27 is a diagram of dynamic characteristics of the fifth example.
Figure 28:
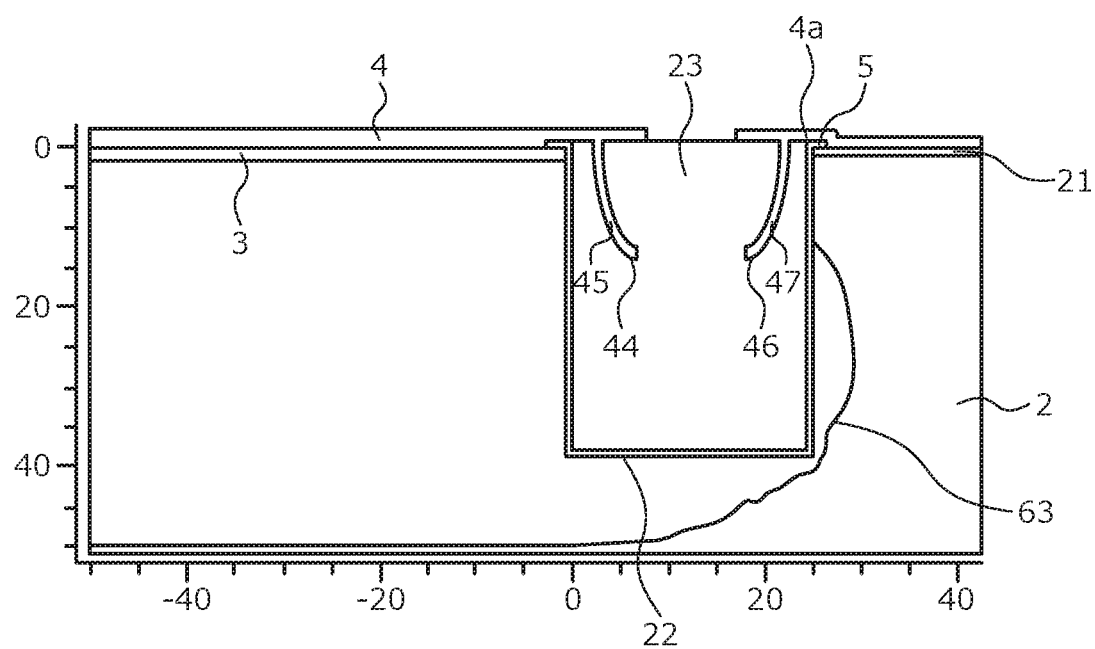
FIG. 28 is a diagram of dynamic characteristics of a sixth example.

Dynamic characteristics of the FPs 45, 47 were verified. FIG. 26 is a diagram of static characteristics of a fifth example. FIG. 27 is a diagram of dynamic characteristics of the fifth example. FIG. 28 is a diagram of dynamic characteristics of a sixth example. A diode (hereinafter, fifth example: refer to FIGS. 14A and 14B) in which the FP 45 that curves outwardly is embedded inside the embedded insulating film 23 was produced according to the method of manufacturing the semiconductor device according to the second embodiment described above. A state (static state) of a depletion layer 61 that extends outwardly from the main junction 20 of the active region 11 during a steady state of the fifth example is depicted in FIG. 26; and a state (dynamic state) of a depletion layer 62 that extends from the main junction 20 of the active region 11 when high dV/dt is applied is depicted in FIG. 27.

Further, a diode (hereinafter, sixth example: refer to FIGS. 21A and 21B) in which inside the embedded insulating film 23, the first FP 45 that curves outwardly and the second FP 47 that curves inwardly are disposed sequentially from an inner side, was produced according to the method of manufacturing the semiconductor device according to the third embodiment described above. A state (dynamic state) of the depletion layer 63 that extends outwardly from the main junction 20 of the active region 11 when high dV/dt is applied is depicted in FIG. 28. High dV/dt is high voltage (noise) needed for high speed switching and voltage fluctuation dV/dt corresponding to switching time may be great.

From the results depicted in FIG. 26, it was confirmed that during the steady state of the fifth example, the depletion layer 61 that extends outwardly from the main junction 20 of the active region 11 can be stopped at a state along the outer side wall 22b of the trench 22. The reason for this is that in a portion of the n−-type drift region 2, along the outer side wall 22b of the trench 22, electrons are induced and an n-type region 61a that is formed by these induced electrons is formed. The n-type region 61a functions as a channel stopper and has a function of modulating the electric field distribution such that locations where electric field concentrates are contained inside the embedded insulating film 23.

From the results depicted in FIG. 27, during high dV/dt application to the fifth example, the depletion layer 62 that extends outwardly from the main junction 20 of the active region 11 spreads toward the chip end side to a greater extent than during the steady state. The reason for this is that in a portion of the n−-type drift region 2, along the outer side wall 22b of the trench 22, before the n-type region 61a (refer to FIG. 26) is formed, the depletion layer 62 spreads to the chip end side. In this case, depending on the magnitude of the high dV/dt, there is a risk of distribution in which locations where electric field concentrates protrude farther outward than the embedded insulating film 23 and a risk of avalanche breakdown at the n-type channel stopper region 21.

From the results depicted in FIG. 28, in the sixth example, it was confirmed that even during high dV/dt application, the depletion layer 63 that extends outwardly from the main junction 20 of the active region 11 can be stopped at a state along the outer side wall 22b of the trench 22. As a result, the second FP 47 of the sixth example is confirmed to have the same function as the n-type region 61a (refer to FIG. 26)

that is consequent to induced electrons in the portion along the outer side wall 22b of the trench 22 during the steady state.

Figure 29:
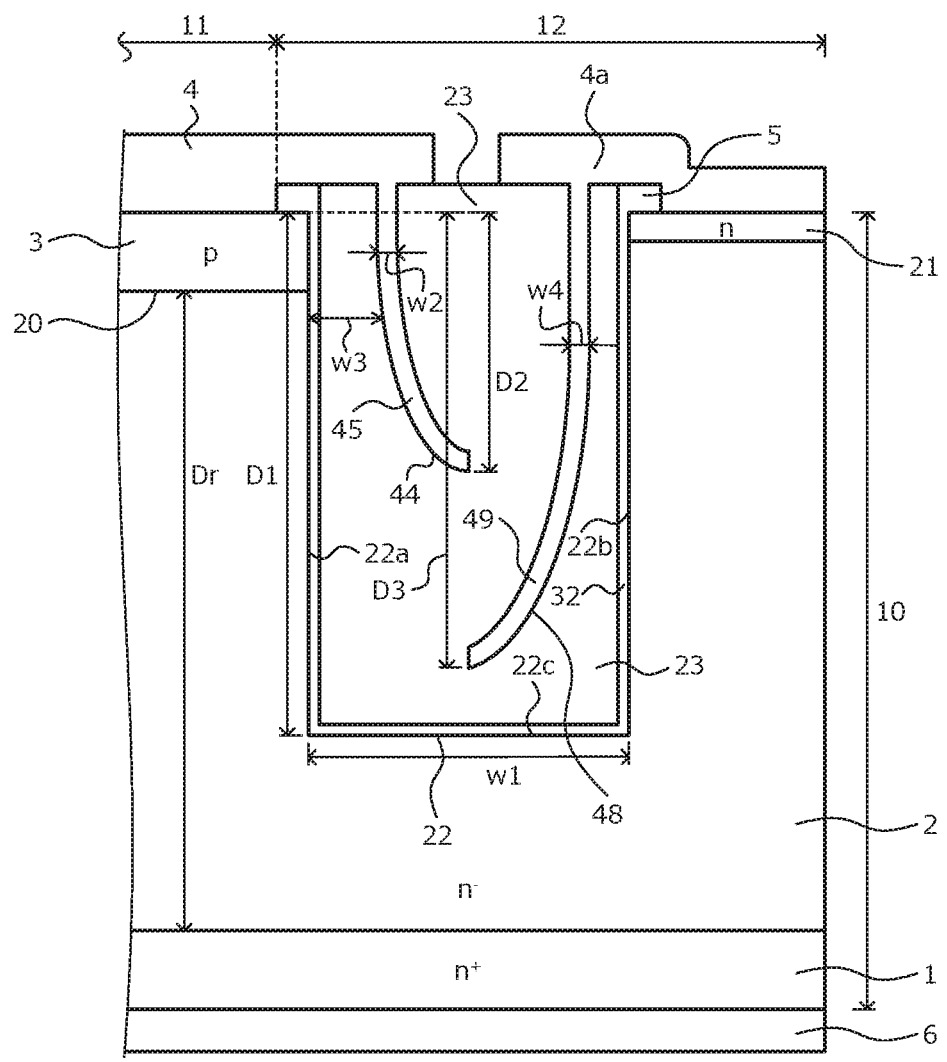
FIG. 29 is a cross sectional view of a structure of the semiconductor device according to a fourth embodiment.

A structure of the semiconductor device according to a fourth embodiment will be described. FIG. 29 is a cross sectional view of a structure of the semiconductor device according to the fourth embodiment. The semiconductor device according to the fourth embodiment differs from the semiconductor device according to the third embodiment in that the depth of a second FP 49 is greater than the depth of the first FP 45. In other words, the depth D3 of a second groove 48 in which the second FP 49 is embedded is deeper than the depth D2 of the first groove 44 in which the first FP 45 embedded. Configuration other than the depth D3 of the second groove 48 of the semiconductor device according to the fourth embodiment is identical to that of the semiconductor device according to the third embodiment.

Figure 30:
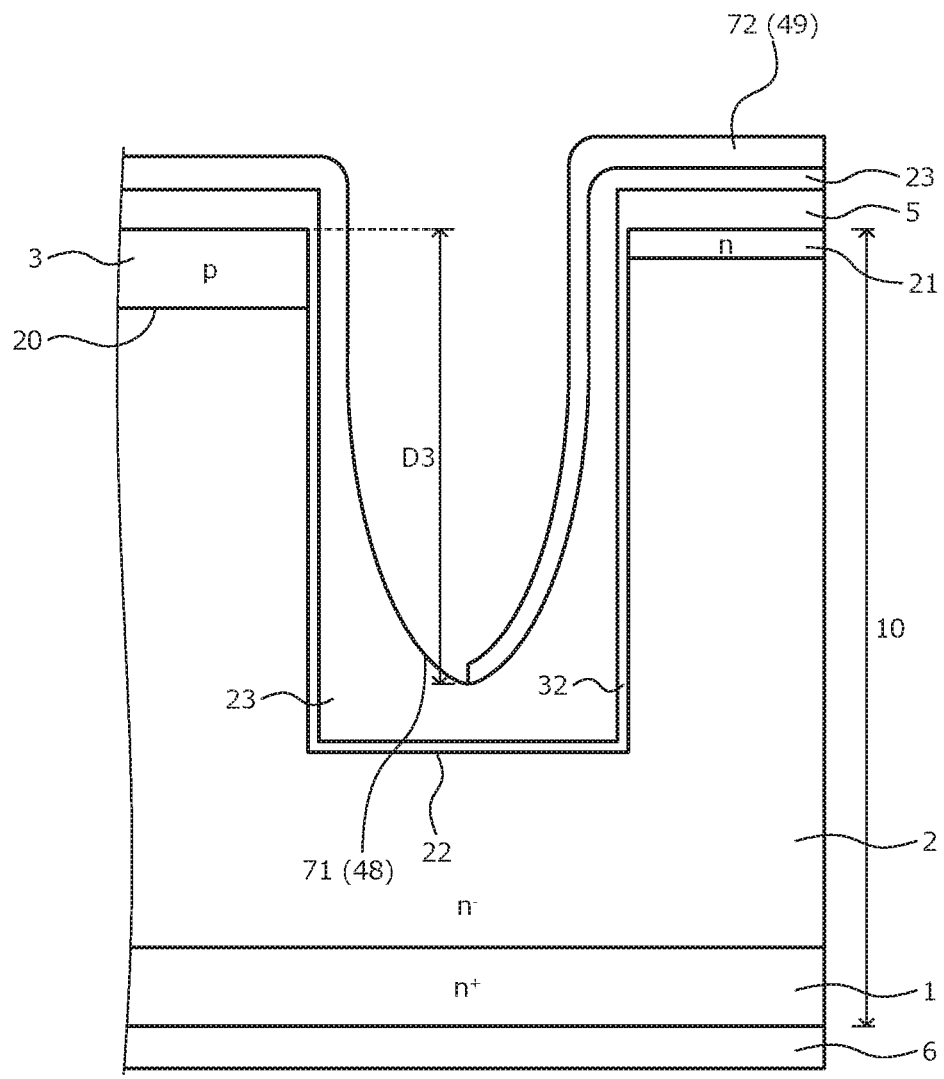
FIG. 30 is a cross sectional view of the semiconductor device according to the fourth embodiment, during manufacture.

The method of manufacturing the semiconductor device according to the fourth embodiment will be described. FIGS. 30 to 33 are cross sectional views during manufacture of the semiconductor device according to the fourth embodiment. Similar to the first embodiment, first, the $n^+$-type supporting substrate 1 is prepared and processes from epitaxial growth of the $n^-$-type drift region 2 to deposition of the LTO film 32 are sequentially performed (refer to FIGS. 2 to 5). Next, as depicted in FIG. 30, the embedded insulating film 23 is deposited along the inner walls of the base front surface and the trench 22. Here, the embedded insulating film 23 is embedded so as to leave a groove 71 having a cross sectional shape that is substantially a U-shape inside the trench 22. The groove 71 later becomes the second groove 48 in which the second FP 49 is embedded. Therefore, the groove 71 is left at the depth D3 from the front surface of the semiconductor base 10.

Next, the embedded insulating film 23 is hardened by heat treatment and subsequently, a metal film 72 that becomes the second FP 49 is deposited along the inner wall of the groove 71. Next, similar to the formation of the first FP of the second embodiment, after the metal film 72 is covered by the reflection preventing film (not depicted), photolithography and etching are performed to pattern the metal film 72 and the reflection preventing film, and a portion of the metal film 72 to become the second FP 49 is left. Next, the resist mask and the reflection preventing film are removed.

Figure 31:
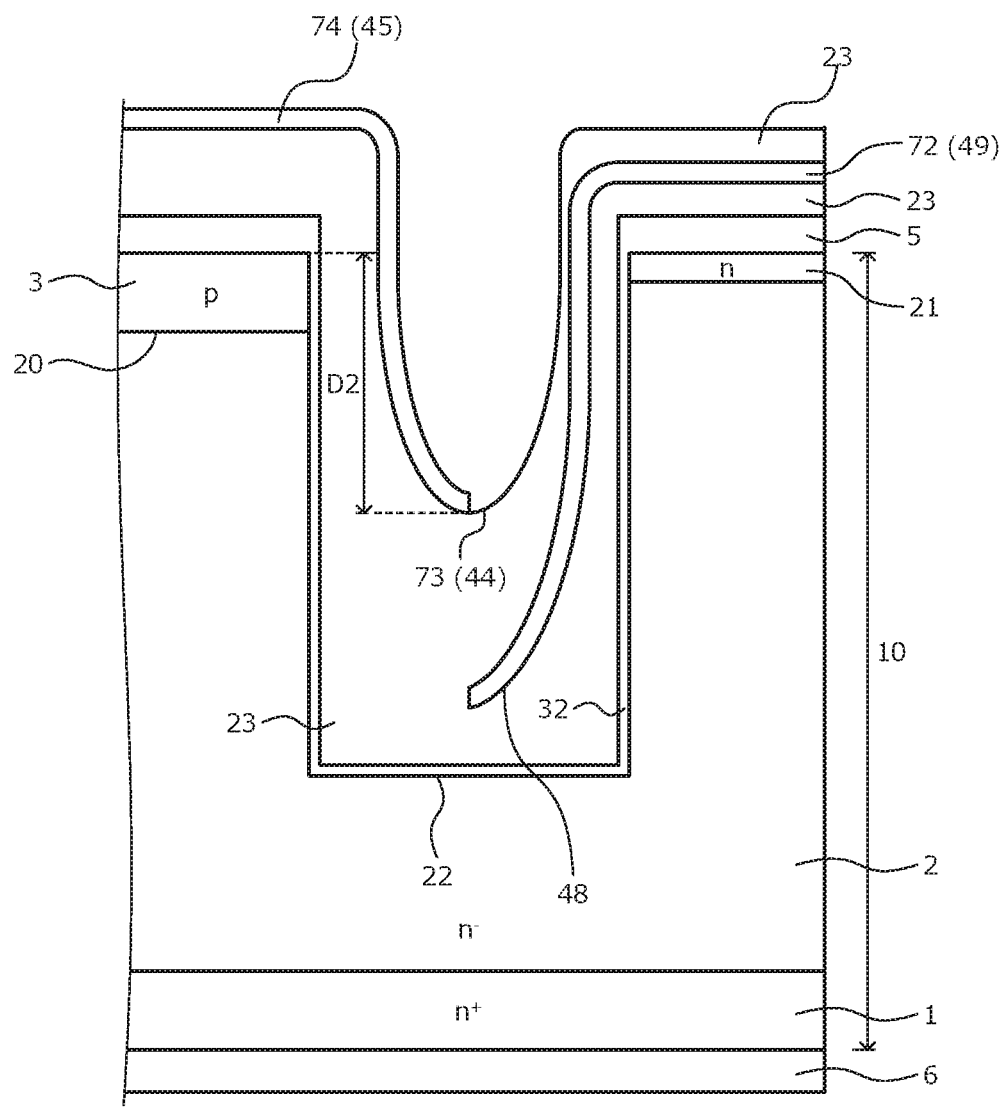
FIG. 31 is a cross sectional view of the semiconductor device according to the fourth embodiment, during manufacture.

Next, as depicted in FIG. 31, the embedded insulating film 23 is deposited inside the trench 22 so as to cover the second FP 49. Here, the embedded insulating film 23 is embedded so as to leave a groove 73 having a having a cross sectional shape that is substantially a U-shape inside the trench 22. The groove 73 later becomes the first groove 44 in which the first FP 45 is embedded. Therefore, the groove 73 is left at the depth D2 from the front surface of the semiconductor base 10.

Next, the embedded insulating film 23 is hardened by heat treatment and a metal film 74 that becomes the first FP 45 is deposited along the inner wall of the groove 73. Next, similar to the second embodiment, after the metal film 74 is covered by the reflection preventing film (not depicted), photolithography and etching are performed to pattern the metal film 74 and the reflection preventing film, and a portion of the metal film 74 to become the first FP 45 is left. Next, the resist mask and the reflection preventing film are removed.

Figure 32:
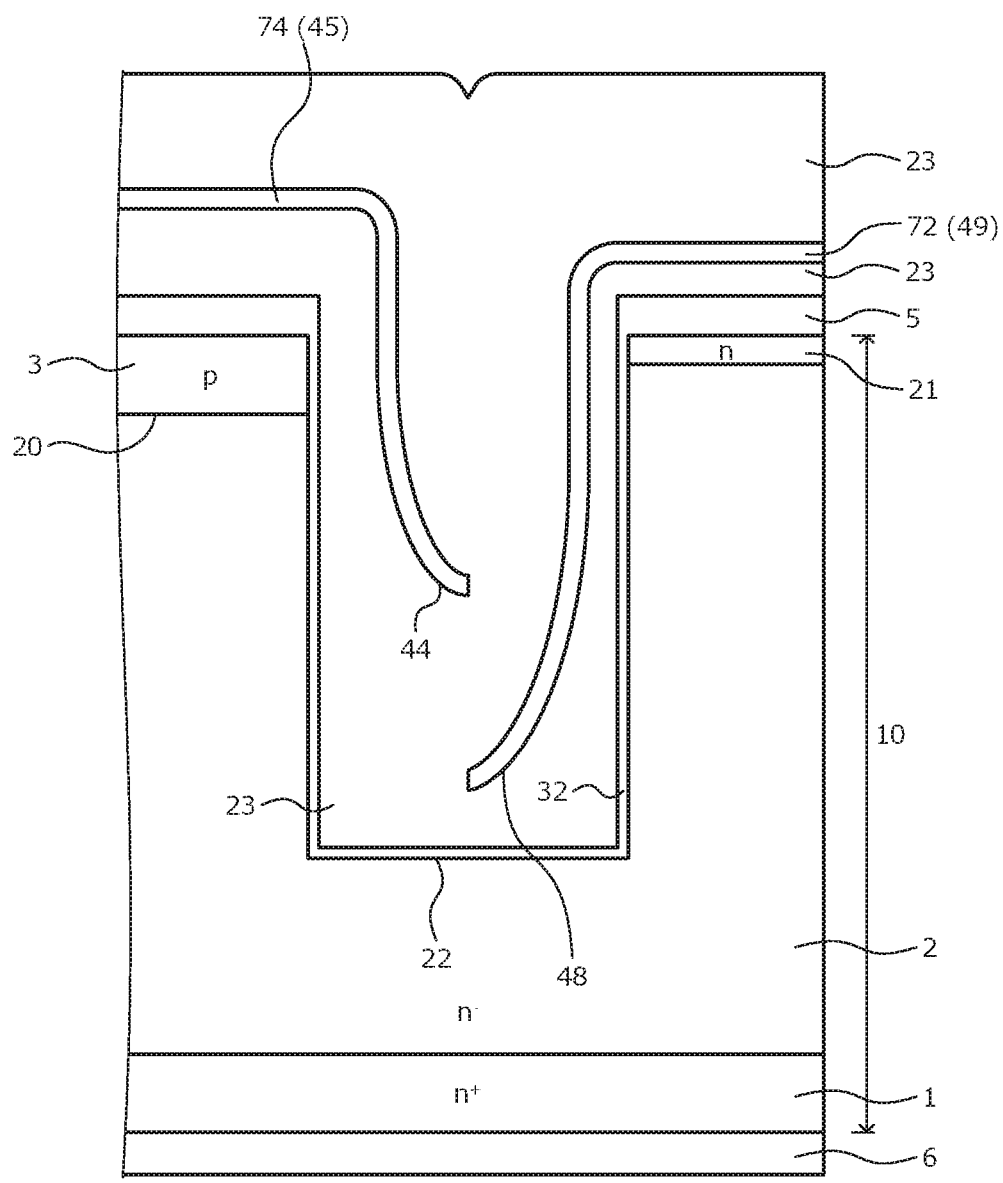
FIG. 32 is a cross sectional view of the semiconductor device according to the fourth embodiment, during manufacture.

Next, as depicted in FIG. 32, after the inside of the trench 22 is completely embedded with the embedded insulating film 23, the embedded insulating film 23 is hardened by heat treatment. As a result, the first and the second grooves 44, 48 in which the first and the second FPs 45, 49 are respectively embedded are formed. The embedding of the embedded insulating film 23 described above suffices to use a spin coat method, similar to the second embodiment.

Figure 33:
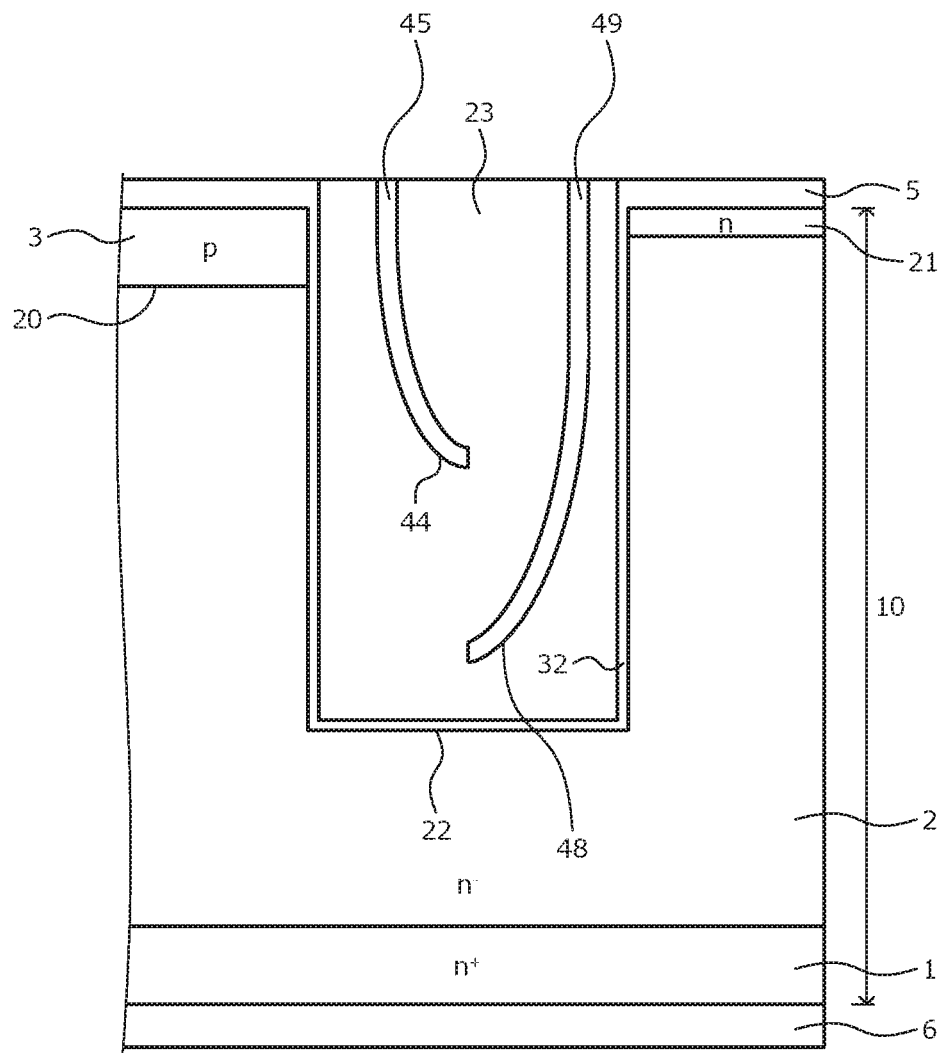
FIG. 33 is a cross sectional view of the semiconductor device according to the fourth embodiment, during manufacture.

Next, as depicted in FIG. 33, the first and the second FPs 45, 49 and the embedded insulating film 23 are polished until the interlayer insulating film 5 is exposed. Next, photolithography and etching are performed to pattern the interlayer insulating film 5 and form a contact hole, exposing the p-type region 3 and the n-type channel stopper region 21. Thereafter, similar to the first embodiment, formation of the front surface electrode 4 and the processes thereafter are sequentially performed, whereby the semiconductor device depicted in FIG. 29 is completed. In the semiconductor device according to the fourth embodiment, the stopper electrode 4a is formed concurrently with a process of forming the front surface electrode 4 or at a process after formation of the front surface electrode 4.

As described above, according to the fourth embodiment, effects similar to those of the first to the third embodiments can be achieved. Further, according to the fourth embodiment, by making the depth of the second FP deep, electric field distribution that contains locations where electric field concentrates, to be inside the embedded insulating film can be more assuredly obtained.

Figure 34:
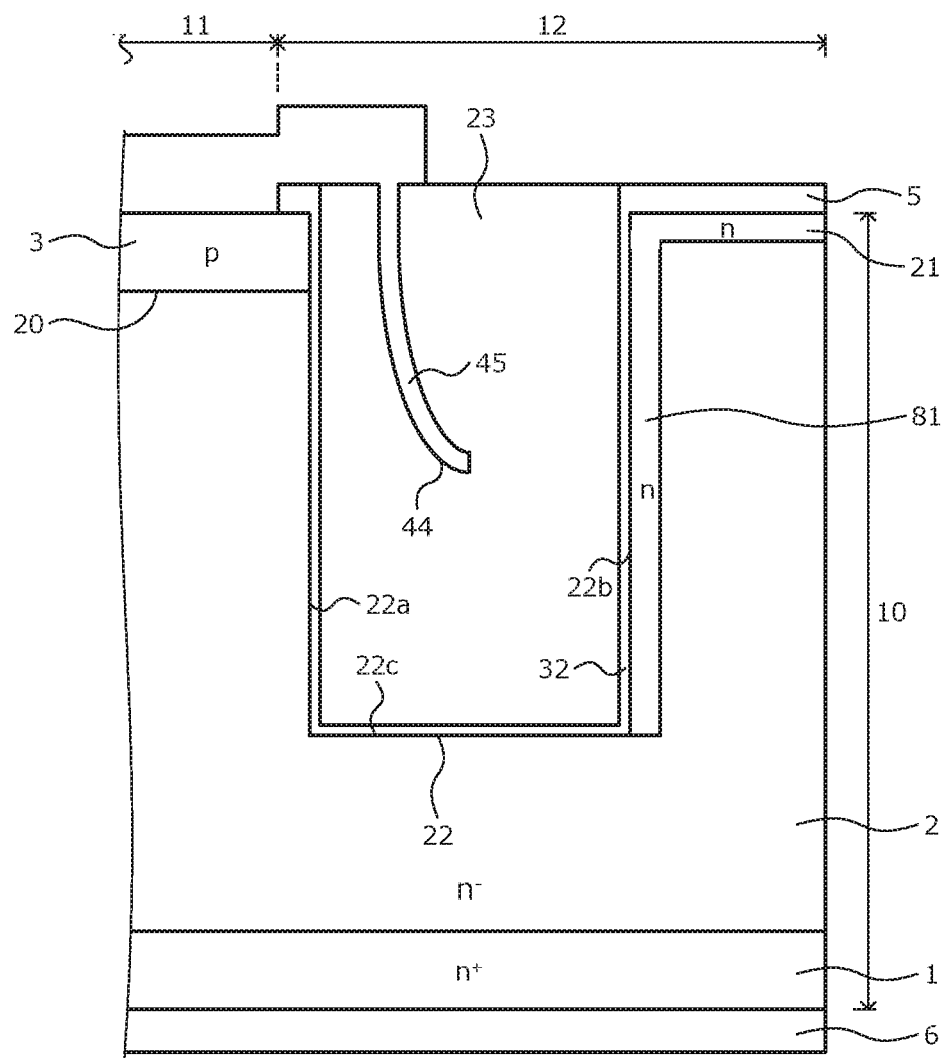
FIG. 34 is a cross sectional view of a structure of the semiconductor device according to a fifth embodiment.

A structure of the semiconductor device according to the fifth embodiment will be described. FIG. 34 is a cross sectional view of the structure of the semiconductor device according to the fifth embodiment. The semiconductor device according to the fifth embodiment differs from the semiconductor device according to the second embodiment in that an n-type region 81 is disposed in a portion of the $n^-$-type drift region 2, along the outer side wall 22b of the trench 22.

The n-type region 81 is disposed to be exposed to the outer side wall 22b of the trench 22. Further, the n-type region 81 is connected to the n-type channel stopper region 21. The n-type region 81 has a function identical to the n-type region 61a (refer to FIG. 26) of the semiconductor device according to the second embodiment and formed by inducted electrons at the end of the depletion layer 61 during the steady state.

The method of manufacturing the semiconductor device according to the fifth embodiment, for example, suffices to form the n-type region 81 at the outer side wall 22b of the trench 22 by oblique ion implantation after formation of the trench 22 and before sacrificial oxidation of the inner wall of the trench 22 in the method of manufacturing the semiconductor device according to the second embodiment. Oblique ion implantation is ion implantation performed from an oblique direction relative to the base front surface.

The manufacturing method described in the fifth embodiment may be applied to the first embodiment.

As described above, according to the fifth embodiment, disposal of the n-type region in a portion of the $n^-$-type drift region, along the outer side wall of the trench enables effects similar to those of the first to the fourth embodiments to be achieved.

In the description, various design modifications can be made without departing from the spirit of the present invention and in the described embodiments, for example, dimensions, impurity concentration, etc. of components can be set according to required specifications. Further, in the described embodiments, although description is given taking a diode, a MOSFET, etc. as an example, the invention is further applicable to insulated gate bipolar transistors (IGBT). In this case, in place of the n⁺-type supporting substrate, a p⁺-type supporting substrate is used.

Even in the case of an IGBT, the semiconductor base 10 may be a bulk wafer cut from an ingot. The ingot for the bulk wafer may be manufactured by a float zone (FZ) method, a Czochralski (CZ) process, or a magnetic Czochralski (MCZ) process. The semiconductor base 10 may be, for example, a bulk wafer that has been thinned by grinding the back surface side thereof. In this case, the n⁻-type drift region 2 may be of the same impurity concentration as the bulk wafer. A p-type high impurity concentration layer corresponding to a p⁺-type supporting substrate may be formed by introducing a p-type dopant (boron, aluminum, etc.) into the ground surface by ion implantation, etc., and thermal annealing, etc. A thinning process of the semiconductor base 10 may be performed after formation of surface structures such as the FP, the embedded insulating film, and the trench of the present embodiment. Further, in each of the embodiments described above, other than silicon and germanium, the semiconductor base may be a wide bandgap semiconductor base such as silicon carbide (SiC), gallium nitride (GaN), and diamond.

In the third and the fourth embodiments, even in cases where the second FP has a cross sectional shape that is substantially linear, modulation is possible such that electric field distribution is obtained that contains locations where electric field concentrates, to be farther inward within the interior of the embedded insulating film. Further, in the embodiments, although description is given taking a case where an epitaxial substrate is used that is a semiconductor substrate on which a semiconductor layer is epitaxial grown, without limitation hereto, for example, a doping region formed by ion implanting inside a semiconductor substrate, all regions configuring the device, may be used. Further, in the embodiments, although a first conductivity type is assumed to be an n-type and a second conductivity type is assumed to be a p-type, the present invention is further applicable when the first conductivity type is assumed to be a p-type and the second conductivity type is assumed to be an n-type.

Figure 35:
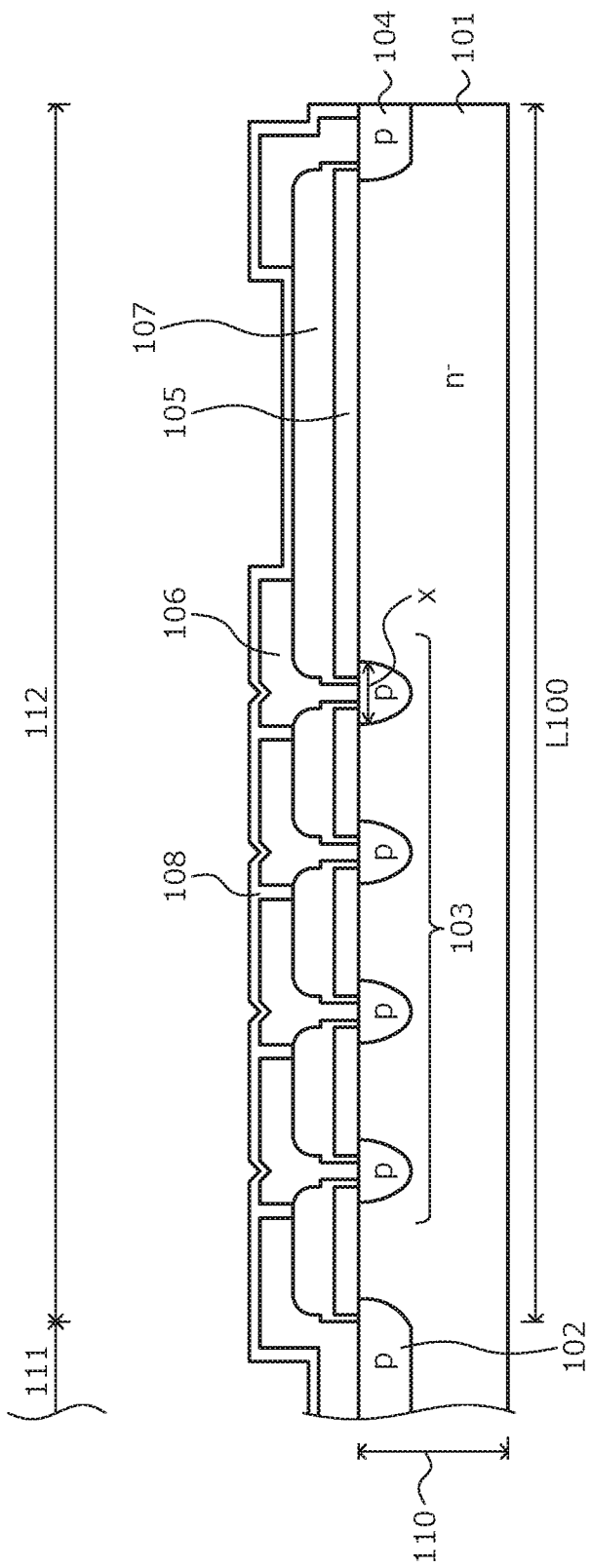
FIG. 35 is a cross sectional view of a structure of an edge termination region of a conventional semiconductor device.

Nonetheless, in the conventional structure depicted in FIGS. 35 and 36, the higher the breakdown voltage is, the greater the curvature of the depletion layer 121 becomes and therefore, although more the FLRs 103 have to be disposed, the depletion layer 121 does not extend to the inside of the FLRs 103. Consequently, the FLRs 103 themselves have a region that does not bear the load of the electric field and thus, the regions that do not bear the load of the electric field increase in the edge termination region 112 as the number of the FLRs 103 increases. Further, in a case where the FPs 106 are disposed, a minimum dimension of a width x of the FLRs 103 is rate limited by the accuracy of processing of the FP 106. Therefore, particularly in a high voltage semiconductor device, a problem arises in that the area occupied by the edge termination region 112 increases. In Japanese Patent No. 5135663, although the area occupied by the edge termination region can be reduced, there is room to further reduce the adverse effects of surface charge and increase the breakdown voltage.

According to the described invention, the electric field near the end of the active region can be relaxed. As a result, breakdown voltage on the same order as the theoretical value of the maximum breakdown voltage that can be obtained by the main junction of the active region can be obtained. Further, the field plate disposed inside the insulating film has a function of shielding the surface charge. In addition, since no FLR is disposed in the edge termination region farther outward than the active region, the width of the edge termination region can be greatly reduced compared to a conventional structure in which FLRs are disposed.

The semiconductor device and the method of manufacturing semiconductor device according to the present invention enable enhancement of the breakdown voltage, reduction of the adverse effects of surface charge, and further reduction of chip size.

As described, the semiconductor device and the method of manufacturing the semiconductor device according to the present invention is useful for various semiconductor devices in which a high voltage structure is disposed in an edge termination region.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device that includes an active region, comprising:
   a semiconductor substrate having first and second principal surfaces;
   a first conductive type region disposed in a first principal side of the semiconductor substrate;
   a second conductive type region disposed on the first conductive type region;
   a trench disposed farther outward than the active region, the trench having a width extending in a first direction, and a depth extending in a second direction, away from the first principal surface of the semiconductor substrate, the trench having first and second side walls;
   a pn junction between the second conductivity type region and the first conductivity type region, the pn junction extending outwardly from the active region in the first direction and being terminated by the trench;
   an insulating film embedded inside the trench;
   a first field plate disposed inside the insulating film and extending in the second direction, a distance between the first side wall of the trench and the first field plate in the first direction being greater than a width of the first field plate, the first field plate curving away from the first side wall of the trench in the first direction, as a depth of the first field plate from the first principal surface of the semiconductor substrate increases;
   a first electrode contacting the second conductivity type region and the first field plate; and
   a second electrode disposed at the second principal surface of the semiconductor substrate.

2. The semiconductor device according to claim 1, wherein the distance between the first side wall of the trench and the first field plate toward the second principal surface of the semiconductor substrate in the first direction is greater than the width of the first field plate.

3. The semiconductor device according to claim 1, wherein in the second direction, a position of a bottom of the first field plate is located deeper than a position of the pn junction and shallower than a position of a bottom of the trench.

4. The semiconductor device according to claim 3, wherein the depth of the first field plate is 30% or more and 70% or less of the depth of the trench.

5. The semiconductor device according to claim 1, further comprising a second field plate disposed inside the insulating film and extending in the second direction, wherein the second field plate is disposed farther outward from the active region than the first field plate, and spaced away from the first field plate in the first direction.

6. The semiconductor device according to claim 5, wherein the second field plate curves away from the second side wall of the trench in the first direction, as a depth of the second field plate from the first principal surface of the semiconductor substrate increases.

7. The semiconductor device according to claim 5, wherein the depth of the second field plate is greater than the depth of the first field plate.

8. The semiconductor device according to claim 1, wherein the semiconductor substrate includes the second conductivity type region, a supporting substrate that contacts the second electrode, and the first conductivity type region disposed between the second conductivity type region and the supporting substrate, and the trench, from the pn junction, reaches a depth in a range of 30% or more to less than 100% of a thickness of the first conductivity type region.

9. The semiconductor device according to claim 1, wherein the width of the trench is 30% or more and 60% or less of the depth of the trench.

* * * * *